(12) United States Patent
Ardo et al.

(10) Patent No.: US 9,947,816 B2
(45) Date of Patent: Apr. 17, 2018

(54) SEMICONDUCTOR STRUCTURES FOR FUEL GENERATION

(71) Applicant: California Institute of Technology, Pasadena, CA (US)

(72) Inventors: Shane Ardo, Pasadena, CA (US); Matthew Shaner, San Luis Obispo, CA (US); Robert Coridan, Pasadena, CA (US); Nicholas C. Strandwitz, Easton, PA (US); James R. McKone, Pasadena, CA (US); Katherine Fountaine, Pasadena, CA (US); Harry A. Atwater, S. Pasadena, CA (US); Nathan S. Lewis, La Canada Flintridge, CA (US)

(73) Assignee: California Institute of Technology, Pasadena, CA (US)

( * ) Notice: Subject to any disclaimer, the term of this patent is extended or adjusted under 35 U.S.C. 154(b) by 849 days.

(21) Appl. No.: 13/856,353

(22) Filed: Apr. 3, 2013

(65) Prior Publication Data
US 2013/0269761 A1    Oct. 17, 2013

Related U.S. Application Data

(60) Provisional application No. 61/619,661, filed on Apr. 3, 2012, provisional application No. 61/621,819, filed on Apr. 9, 2012.

(51) Int. Cl.
| | | |
|---|---|---|
| H01L 31/0352 | (2006.01) | |
| H01L 31/0725 | (2012.01) | |
| H01L 31/18 | (2006.01) | |
| C01B 3/04 | (2006.01) | |

(Continued)

(52) U.S. Cl.
CPC ...... *H01L 31/035281* (2013.01); *C01B 3/042* (2013.01); *C25B 1/003* (2013.01); *H01L 31/035227* (2013.01); *H01L 31/078* (2013.01); *H01L 31/0725* (2013.01); *H01L 31/1892* (2013.01); *Y02E 10/50* (2013.01); *Y02E 60/364* (2013.01)

(58) Field of Classification Search
CPC .. C01B 3/042; H01L 31/035227; C25B 1/003
USPC ............................ 136/255; 257/184; 438/74
See application file for complete search history.

(56) References Cited

U.S. PATENT DOCUMENTS

| | | | |
|---|---|---|---|
| 4,358,676 | A | 11/1982 | Childs et al. |
| 5,314,569 | A | 5/1994 | Pribat |
| 5,336,558 | A | 8/1994 | Debe |

(Continued)

FOREIGN PATENT DOCUMENTS

| | | | |
|---|---|---|---|
| CN | 1669920 A | 9/2005 | |
| CN | 1676568 A | 10/2005 | |

(Continued)

OTHER PUBLICATIONS

Feng et al., CN 101728458 A, English Machine Translation, Jun. 9, 2010, pp. 1-9.*

(Continued)

*Primary Examiner* — Tae-Sik Kang
(74) *Attorney, Agent, or Firm* — Gavrilovich, Dodd & Lindsey LLP

(57) ABSTRACT

This disclosure relates to photovoltaic and photoelectrosynthetic cells, devices, methods of making and using the same.

23 Claims, 8 Drawing Sheets

(51) Int. Cl.
*C25B 1/00* (2006.01)
*H01L 31/078* (2012.01)

(56) References Cited

U.S. PATENT DOCUMENTS

| | | |
|---|---|---|
| 5,352,651 A | 10/1994 | Debe |
| 5,976,957 A | 11/1999 | Westwater et al. |
| 6,306,734 B1 | 10/2001 | Givargizov |
| 6,518,494 B1 | 2/2003 | Shibuya et al. |
| 6,649,824 B1 | 11/2003 | Den |
| 6,720,459 B2 | 4/2004 | Curtis et al. |
| 7,057,881 B2 | 6/2006 | Chew et al. |
| 7,105,428 B2 | 9/2006 | Pan et al. |
| 7,109,517 B2 | 9/2006 | Zaidi |
| 7,116,546 B2 | 10/2006 | Chew |
| 7,148,417 B1 | 12/2006 | Landis |
| 7,238,594 B2 | 7/2007 | Fenash et al. |
| 7,253,017 B1 | 8/2007 | Roscheisen et al. |
| 7,253,442 B2 | 8/2007 | Huang |
| 7,259,324 B2 | 8/2007 | Zeira |
| 7,309,620 B2 | 12/2007 | Fonash et al. |
| 7,335,259 B2 | 2/2008 | Hanrath et al. |
| 7,521,274 B2 | 4/2009 | Hersee et al. |
| 7,560,366 B1 | 7/2009 | Romano et al. |
| 7,592,555 B2 | 9/2009 | Kuekes et al. |
| 7,666,708 B2 | 2/2010 | Lieber et al. |
| 7,818,816 B1 | 10/2010 | Reppert et al. |
| 7,820,064 B2 | 10/2010 | Jin |
| 7,932,106 B2 | 4/2011 | Li |
| 7,998,788 B2 | 8/2011 | Guba et al. |
| 2002/0172820 A1 | 11/2002 | Majumdar et al. |
| 2004/0213307 A1 | 10/2004 | Lieber et al. |
| 2005/0098204 A1 | 5/2005 | Roscheisen et al. |
| 2005/0167647 A1 | 8/2005 | Huang et al. |
| 2005/0227391 A1 | 10/2005 | Jin et al. |
| 2005/0253138 A1 | 11/2005 | Choi et al. |
| 2005/0279274 A1 | 12/2005 | Niu et al. |
| 2006/0118791 A1 | 6/2006 | Leu |
| 2006/0207647 A1 | 9/2006 | Tsakalakos et al. |
| 2007/0032076 A1 | 2/2007 | Lee et al. |
| 2007/0099008 A1 | 5/2007 | Shimizu et al. |
| 2007/0122313 A1 | 5/2007 | Li et al. |
| 2007/0157964 A1 | 7/2007 | Gronet |
| 2007/0166899 A1 | 7/2007 | Yao et al. |
| 2007/0232028 A1 | 10/2007 | Lee et al. |
| 2007/0278476 A1 | 12/2007 | Black |
| 2008/0006319 A1 | 1/2008 | Bettge et al. |
| 2008/0041439 A1 | 2/2008 | Achutharaman et al. |
| 2008/0072961 A1 | 3/2008 | Liang et al. |
| 2008/0075954 A1 | 3/2008 | Wardle et al. |
| 2008/0093698 A1 | 4/2008 | Tsakalakos et al. |
| 2008/0110486 A1* | 5/2008 | Tsakalakos ............ B82Y 20/00 136/244 |
| 2008/0134089 A1 | 6/2008 | Tsakalakos et al. |
| 2008/0135089 A1* | 6/2008 | Tsakalakos ......... H01L 31/0352 136/248 |
| 2008/0169017 A1 | 7/2008 | Korevaar et al. |
| 2008/0169019 A1* | 7/2008 | Korevaar ........ H01L 31/022425 136/251 |
| 2008/0230120 A1* | 9/2008 | Reddy .................. H01L 27/302 136/260 |
| 2008/0276987 A1 | 11/2008 | Flood |
| 2008/0315430 A1 | 12/2008 | Weber et al. |
| 2009/0020150 A1 | 1/2009 | Atwater et al. |
| 2009/0020853 A1 | 1/2009 | Kayes et al. |
| 2009/0050204 A1 | 2/2009 | Habib |
| 2009/0032412 A1 | 3/2009 | Lewis et al. |
| 2009/0057839 A1 | 3/2009 | Lewis et al. |
| 2009/0078303 A1 | 3/2009 | Brezoczky et al. |
| 2009/0127540 A1 | 5/2009 | Taylor |
| 2009/0152527 A1 | 6/2009 | Lee et al. |
| 2009/0165844 A1 | 7/2009 | Dutta |
| 2009/0165849 A1 | 7/2009 | Chan et al. |
| 2009/0266411 A1 | 10/2009 | Habib et al. |
| 2010/0108131 A1 | 5/2010 | Guha et al. |
| 2010/0175748 A1 | 7/2010 | Karg |
| 2010/0221866 A1 | 9/2010 | Graham et al. |
| 2011/0096218 A1 | 4/2011 | Bratkovski et al. |
| 2011/0126891 A1 | 6/2011 | Goto et al. |
| 2011/0139209 A1 | 6/2011 | Lang et al. |
| 2011/0269264 A1 | 11/2011 | Korevaar et al. |
| 2012/0000525 A1 | 1/2012 | Flood |
| 2012/0006390 A1 | 1/2012 | Huo et al. |
| 2012/0031486 A1 | 2/2012 | Parce et al. |

FOREIGN PATENT DOCUMENTS

| | | |
|---|---|---|
| CN | 1808688 A | 7/2006 |
| CN | 101728458 A * | 6/2010 |
| JP | 6-508678 | 9/1994 |
| JP | 11-214720 | 8/1999 |
| JP | 2000-269561 | 9/2000 |
| JP | 2001-135516 | 5/2001 |
| JP | 2004-152787 | 5/2004 |
| JP | 2005-310388 | 4/2005 |
| JP | 2005-194609 | 7/2005 |
| JP | 2005-111200 | 10/2005 |
| JP | 2005-303301 | 10/2005 |
| JP | 2005-310821 | 11/2005 |
| JP | 2006-128233 | 5/2006 |
| JP | 2007-091485 | 4/2007 |
| JP | 2007-126311 | 5/2007 |
| JP | 2009-537339 A | 10/2009 |
| KR | 10-2007-18457 | 2/2007 |
| KR | 10-2008-0044181 A | 5/2008 |
| WO | 93/00560 | 1/1993 |
| WO | 2003/005450 A2 | 1/2003 |
| WO | 2006/138671 A2 | 12/2006 |
| WO | 2008/054541 A2 | 5/2008 |
| WO | 2008/135905 A2 | 11/2008 |
| WO | 2009/012459 A2 | 1/2009 |
| WO | 2009/032412 A1 | 3/2009 |

OTHER PUBLICATIONS

Baharlou, Simin, International Preliminary Report on Patentability and Written Opinion, PCT/US2013/035171, dated Oct. 16, 2014, The International Bureau of WIPO.

Kim, Do Weon, International Search Report and Written Opinion, PCT/US2013/035171, dated Jul. 24, 2013, Korean Intellectual Property Office.

Office Action issued in Japanese Patent Application No. 2010-522999, dated Mar. 5, 2013.

Office Action issued in Chinese Patent Application No. 200880107746.5, dated Sep. 27, 2011.

Office Action issued in Chinese Patent Application No. 20080102837.X, dated Oct. 9, 2011.

Altermatt, P. et al., "Simulation of optical properties of Si wire cells", 34th IEEE Photovoltaic Specialists Conference, 2009, 000972-000977.

Anandan et al., "Room temperature growth of CuO nanorod arrays on copper and their application as a cathode in dye-sensitized solar cells", Materials Chemistry and Physics, 93 (2005), 35-40.

Anandan, Sambandam, "Recent improvements and arising challenges in dye-sensitized solar cells", Solar Energy Materials & Solar Cells, 91 (2007) 843-846.

Aspnes, D.E., "Optical functions of intrinsic c-Si for photon energies up to 7.5 eV: table", Properties of Crystalline Silicon, 1999, 683-690.

Baharlou, Simin, International Preliminary Report on Patentability issued in PCT/US2011/029663, The International Bureau of WIPO, dated Oct. 4, 2012.

Bai, Lingfei, International Preliminary Report on Patentability, PCT/US2010/058314, The International Bureau of WIPO, dated Jun. 14, 2012.

Balakrisnan et al., "Patterning PDMS using a combination of wet and dry etching", J. Micromech. Microeng., 19 (2009) 047002.1-047002.7.

Basol et al., "Ultra-Thin Electrodeposited CdS/CdTe Heterojunction with 8% Efficiency", IEEE Photo. Spec. Conf., 1982, 805-808.

(56) References Cited

OTHER PUBLICATIONS

Basol, B., "High-efficiency electroplated heterojunction solar cell", J. Appl. Phys. 55(2), 1984, pp. 601-603.
Basol, B., "Thin Film CdTe Solar Cells—A Review", Conf. Rec. IEEE Photo. Spec. Conf., 1990, 588-594.
Bhattacharya et al., "Electrodeposition of CdTe Thin Films", 1984, 131, 2032-2041.
Bierman et al., "Potential applications of hierchical branching nanowires in solar energy", Energy Environ. Sci., 2009, 1050-1059.
Boettcher, Shannon W. et al., "Energy-Conversion Properties of Vapor-Liquid-Solid-Grown Silicon Wire-Array Photocathodes", Science, 2010, 327:185-187.
Bogart et al., "Diameter-Controlled Synthesis of Silicon Nanowires Using Nanoporous Alumina Membranes", Adv. Mater. 2005, 17 (1), 114-117.
Brown et al., "Impurity photovoltaic effect: Fundamental energy conversion efficiency limits", Journal of Applied Physics, vol. 92, No. 3, 2002, 1329-1336.
Bullis, W.M., "Properties of Gold in Silicon", Solid-State Electronics, Pergamon Press, 1966, vol. 9, pp. 143-168.
Campbell et al., "The Limiting Efficiency of Silicon Solar Cells under Concentrated Sunlight", IEEE Transactions on Electron Devices, vol. ED-33, No. 2, 1986, 234-239.
Choi, Jeong Yoon, Search Report for PCT/US2008/070509, Korean Intellectual Property Office, dated Feb. 20, 2009.
Choi, Jeong Yoon, Written Opinion for PCT/US2008/070509, Korean Intellectual Property Office, dated Feb. 20, 2009.
Chu et al., "Large Area Polycrystalline Silicon Solar Cells on Unidirectionally Solidified Acid-Treated Metallurigcal Grade Silicon", Proc. IEEE Southeastcon, 1989, 1436-1441.
Colombo et al., "Gallium arsenide p-i-n radial structures for photovoltaic applications", Applied Physics Letters, 94, 2009, 173108-1-173108-3.
Davis, Jr. et al., "Impurities in Silicon Solar Cells", IEEE Transactions on Electron Devices, vol. ED-27, No. 4, Apr. 1980, 677.
de Dood, Michiel Jacob Andries, "Silicon photonic crystals and spontaneous emission", Thesis, Utrecht University, 2002.
Dong et al., "Coaxial Group III—Nitride Nanowire Photovoltaics", Nano Letters, 2009, vol. 9, No. 5, 2183-2187.
Erts et al., "High Density Germanium Nanowire Assemblies: Contact Challenges and Electrical Characterization", J. Phys. Chem. B2006, 110, 820-826.
Fan et al., "Semiconductor Nanowires: From Self-Organization to Patterned Growth", Small 2(6), 700-717 (2006).
Fan et al., "Well-ordered ZnO nanowire arrays on GaN substrate fabricated via nanosphere lithography", Journal of Crystal Growth, 287 (2006) 34-38.
Fan et al., "Three-dimensional nanonpillar-array photovoltaics on low-cost and flexible substrates", Nature Mater., 2009, 8:648-653.
Fang et al., "Long Germanium Nanowires Prepared by Electrochemical Etching", Nano Letters, 2006, vol. 6, No. 7, 1578-1580.
Forouhi et al., "Optical dispersion relations for amorphous semiconductors and amorphous dielectrics", Physical Review B, vol. 34, No. 10, 1986, 7018-7026.
Fulop et al., "High-efficiency electrodeposited cadmium telluride solar cells", Appl. Phys. Lett., 1982, 40, 327-328.
Garnett et al., "Silicon Nanowire Radial p-n Junction Solar Cells", JACS, 130, 9224-9225, published on line Jun. 25, 2008.
Garnett et al., "Light Trapping in Silicon Nanowire Solar Cells", Nano Letters, 2010, 10:1082-1087.
Ghebrebrhan et al., "Global optimization of silicon photovoltaic cell front coatings", Optics Express, Apr. 22, 2009.
Gibbons et al., "A 14% efficient nonaqueous semiconductor/liquid junction solar cell", Appl. Phys. Lett., 1984, 45, 1095-1097.
Givargizov, "Growth of Whiskers from the Vapor Phase", Highly Anisotropic Crystals, D. Reidel, Dordrecht, Holland, 1987, p. 169.
Goodey et al., "Silicon Nanowire Array Photoelectrochemical Cells", J. Am. Chem. Soc., 2007, 129 (41), 12344-12345.
Goto et al., "Molecular Nanojet in Water", Applied Phys. Express, 2 (2009) 035004-1-035004-2.
Goto et al., "Growth of Core-Shell InP Nanowires for Photovoltaic Application by Selective-Area Metal Organic Vapor Phase Epitaxy", Applied Physics Express 2 (2009) 035004-1-035004-3.
Gowrishankar et al., "Fabrication of densely packed, well-ordered, high-aspect-ratio silicon nanopillars over large areas using block copolymer lithography", Thin Solid Films, 2006, 513, 289-294.
Green, MA, "Optical Properties of Silicon", pveducation.org, accessed Jan. 10, 2014.
Gronet et al., "n-Type silicon photoelectrochemistry in methanol: Design of a 10.1% efficient semiconductor/liquid junction solar cell", Proc. Natl. Acad. Sci. USA, vol. 80, pp. 1152-1156, Feb. 1983.
Gstrein et al., "Effects of Interfacial Energetics on the Effective Surface Recombination Velocity of Si/Liquid Contacts", J. Phys. Chem., B2002, 106, 2950-2961.
Gu et al., "Quantitative Measurement of the Electron and Hole Mobility—Lifetime Products in Semiconductor Nanowires", Nano Letters, 2006, vol. 6, No. 5, 948-952.
Gunawan et al., "Characteristics of vapor-liquid-solid grown silicon nanowire solar cells", Solar Energy Materials & Solar Cells, 93 (2009) 1388-1393.
Guo, L. Jay, "Nanoimprint Lithography: Methods and Material Requirements", Advanced Materials, 19, 495-513, 2007.
Guttler, G. et al., "Photovoltaic Effect of Gold in Silicon", J. Appl. Phys., 1969, 40:4994-4995.
Guttler, G. et al., "Impurity Photovoltaic Effect in Silicon", Energy Conversion, 1970, 10:51-55.
Haick et al., "Electrical Characteristics and Chemical Stability of Non-Oxidized, Methyl-Terminated Silicon Nanowires", J. Am. Chem. Soc., 2006, 128, 8990-8991.
Harris et al., "Semiconductors for Photoelectrolysis", Ann Rev. Mater. Sci., 1978, 8:99-134.
Haxel et al., "Rare Earth Elements—Critical Resources for High Technology", U.S. Geological Survey Fact Sheet, 087-02, 2002, p. 3.
Hochbaum et al., "Controlled Growth of Si Nanowire Arrays for Device Integration", Nano Letters, 2005, vol. 3, No. 3, 457-460.
Hopkins et al., "Impurity Effects in Silicon for High Efficiency Solar Cells", Journal of Crystal Growth 75 (1986) 67-79.
Hu et al., "Analysis of Optical Absorption in Silicon Nanowire Arrays for Photovoltaic Applications", Nano Letters, vol. 7, No. 11, Nov. 2007, 3249-3252.
Huang et al., "Microstructured silicon protector", Applied Physics Letters, 89, 033506.1-033506.3, 2006.
Huang et al., "Fabrication of Silicon Nanowire Arrays with Controlled Diameter, Length, and Density", Advanced Materials, 19, 744-748 (2007).
Huynh et al., "Hybrid Nanorod-Polymer Solar Cells", Science, 295, 2425 (2002).
Ismail et al., "Hydrogen Gas Production for Electronic-Grade Polycrystalline Silicon Growth", IEEE ICSE, 2002, 53-56.
Jacoboni et al., "A Review of Some Charge Transport Properties of Silicon", Solid State Electronics, 1977, vol. 20, 77-89I.
Jenny et al., "Semiconducting Cadmium Telluride", Physical Review, vol. 96, No. 5, Dec. 1, 1954, 1190-1191.
Jung et al., "Aligned Carbon Nanotube-Polymer Hybrid Architectures for Diverse Flexible Electronic Applications", Nano Letters, 2006, vol. 6, No. 3, pp. 413-418.
Kang et al., "Hybrid solar cells with vertically aligned CdTe nanorods and a conjugated polymer", Applied Physics Letters, 86, Issue 11, 113101-1-113101-3 (2005).
Kang et al., "Well-aligned CdS nanorod/conjugated polymer solar cells", Solar Energy Materials & Solar Cells, 90 (2006) 166-174.
Kawano et al., "Fabrication and properties of ultrasmall Si wire arrays with circuits by vapor-liquid-solid growth", Sensors and Actuators, A 97-98 (2002) 709-715.
Kayes et al., "Radial PN Junction Nanorod Solar Cells: Device Physics Principles and Routes to Fabrication in Silicon", IEEE PVSC, 2005, pp. 55-58.
Kayes et al., "Synthesis and Characterization of Silicon Nanorod Arrays for Solar Cell Applications", IEEE WCPEC, 2006, 1, 221-224.

(56) References Cited

OTHER PUBLICATIONS

Kayes et al., "Growth of vertically aligned Si wire arrays over large areas (>1cm2) with Au and Cu Catalysts", Supplementary Material, App. Phys. Letter, 91, 103110 (2007).
Keevers et al., "Efficiency Improvements of Silicon Solar Cells by the Impurity Photovoltaic Effect", IEEE 1993, Photovoltaic Specialists Conference, 140-146.
Kelzenberg et al., "Photovoltaic Measurements in Single-Nanowire Silicon Solar Cells", Nano Letters, 2008, vol. 8, No. 2, pp. 710-714.
Kelzenberg et al., "Single-nanowire Si solar cells", 33rd IEEE Photovoltaic Specialists Conference, 2008, 1-6.
Kelzenberg et al., "Predicted efficiency of Si wire array solar cells," 34th IEEE Photovoltaic Specialists Conference, 2009, 001948-001953.
Kelzenberg et al., "Enhanced absorption and carrier collection in Si wire arrays for photovoltaic applications", Nature Materials, 2010, 9:239-244.
Kempa et al., "Single and Tandem Axial p-i-n Nanowire Photovoltaic Devices", Nano Letters, 2008, vol. 8, No. 10, 3456-3460.
Kim et al. "Photovoltaic Properties of Nano-particulate and Nanorod Array ZnO Electrodes for Dye-Sensitized Solar cell", Bull. Korean Chem. Soc., vol. 27, No. 2, 295-298, Feb. 2006.
Kim et al., "Stretchable and Foldable Silicon Integrated Circuits", Science, 2008, 320, 507-511.
Kim, Min Soo, International Search Report and Written Opinion issued in PCT/US2010/058422, Korean Intellectual Property Office, dated Sep. 16, 2011.
Klein et al., "Electrochemcial Fabrications of Cadmium Chalcogenide Microdiode Arrays", Chem. Mater., 1993, 5, 902-904.
Kressin et al., "Synthesis of Stoichiometric Cadmium Selenide Films via Sequential Monolayer Electrodeposition", Chem. Mater., 1991, 3, 1015-1020.
Kupec et al., "Dispersion, Wave Propagation and Efficiency Analysis of Nanowire Solar Cells," Optical Express, 2009, 17:10399-10410.
Lauhon et al., "Epitaxial core-shell and core-multishell nanowire heterostructures", Nature, vol. 420, Nov. 7, 2002, pp. 57-61.
Law et al., "Semiconductor Nanowires and Nanotubes", Annu. Rev. Mater. Res., 2004, 34:83-122.
Law et al., "Nanowire dye-sensitized solar cells", Nat. Mater., 2005, 4, 455-459.
Lee et al., "Solvent Compatibility of Poly(dimethylsiloxane)-Based Microfluidic Devices", Anal. Chem., 2003, 75, 6544-6554.
Lepiller et al., "New Facets of CdTe Electrodeposition in Acidic Solutions with Higher Tellurium Concentrations", Journal of the Electrochemical Society, 151 (5) C348-C357, 2004.
Lin et al., Efficient photoinduced charge transfer in TiO2 nanorod/conjugated polymer hybrid materials, Nanotechnology, 17 (2006), 5781-5785.
Lindner, Nora, International Preliminary Report on Patentability issued in PCT/US2010/058422, The International Bureau of WIPO, dated Jun. 14, 2012.
Lombardi et al., "Synthesis of High Density, Size-Controlled Si Nanowire Arrays via Porous Anodic Alamina Mask", Chem. Mater., 2006, 18, 988-991.
Lopatiuk-Tirpak et al., "Studies of minority carrier transport in ZnO", Superlattices and Microstructures, 42 (2007), 201-205.
Maiolo et al., "High Aspect Ratio Silicon Wire Array Photoelectrochemical Cells", J. Am. Chem. Soc., 129, 2007, 12346-12347.
Maiolo et al., "Macroporous Silicon as a Model for Silicon Wire Array Solar Cells", J. Phys. Chem. C 2008, 112, 6194-6201.
Marion et al., "Validation of a photovoltaic module energy ratings procedure at NREL", NREL Technical Report, 1999, NREL/TP-520-26909 1-48.
Marion et al., "Validation of a photovoltaic module energy ratings procedure at NREL", NREL Technical Report, 1999, NREL/TP-520-26909 49-97.
Martensson et al., "Fabrication of individually seeded nanowire arrays by vapour-liquid-solid growth", Nanotechnology, 14 (2003) 1255-1258.
McCandless et al., "Cadmium Telluride Solar Cells", In Handbook of Photovoltaic Science and Engineering, 2003, pp. 617-657.
McDonald et al., "Poly(dimethylsiloxane) as a Material for Fabricating Microfluidic Devices", Acc. Chem. Res., 2002, 35 (7), 491-499.
Meissner et al., "Light-Induced Generation of Hydrogen at CdS-Monograin Membranes", Chemical Physics Letters, vol. 96, No. 1, Mar. 25, 1983, pp. 34-37.
Min et al., "Semiconductor Nanowires Surrounded by Cylindrical Al2O3 shells", Journal of Electronic Materials, 2003, 1344-1348.
Wang et al., "Titania-nanotube-array-based photovoltaic cells", Appl. Phys. Lett, 89, 023508 (3 pages), 2006.
Westwater et al., "Control of the Size and Position of Silicon Nanowires Grown via the Vapor-Liquid-Solid Technique", Jpn. J. Appl. Phys., vol. 36 (1997) pp. 6204-6209.
Westwater et al., "Si Nanowires Grown via the Vapour-Liquid-Solid Reaction", Phys. Stat. Sol. (a) 165, 37-42 (1998).
Wolf et al., "Limitations and Possibilities for Improvement of Photovoltaic Solar Energy Converters* Part I: Considerations for Earth's Surface Operations", Proceedings of IRE, 1960, 48:1246-1263.
Wolfbauer, Georg, Communication Pursuant to Rule 70(2) and 70a(2) EPC, European Patent Application No. 08782075.9, dated Oct. 18, 2011.
Wolfbauer, Georg, Communication Pursuant to Article 94(3) EPC, European Patent Application No. 08782075.9, dated Mar. 5, 2014.
Woodruff et al., "Vertically Oriented Germanium Nanowires Grown from Gold Colloids on Silicon Substrates and Subsequent Gold Removal", Nano Letters, 2007, vol. 7, No. 6, 1637-1642.
Wu et al., "A Study on Deep Etching of Silicon Using Ethylene-Diamine-Pyrocatechol-Water", Sensors and Actuators, 9 (1986) 333-343.
Wu et al., "Semiconductor nanowire array: potential substrates for photocatalysis and photovoltaics", Topics in Catal., 2002, 19 (2), 197-202.
Xia et al., "One-Dimensional Nanostructures: Synthesis, Characterization, and Applications", Adv. Mater., 2003, 15(5), 353-389.
Yablonovitch, E. et al., "Statistical ray optics", Journal of the Optical Society of America, 1982, 72:899-907.
Yablonovitch, E. et al., "Unusually low surface-recombination velocity on silicon and germanium surfaces", Physical Review Letters, 1986, 57:249-252.
Yang et al., "Experimental Observation of an Extremely Dark Material by a Low-Density Nanotube Array", Nano Letters, 2008, vol. 8, No. 2, 446-451.
Yao et al., "Si nanowires synthesized with Cu catalyst", Materials Letters, 61 (2007), pp. 177-181.
Yoon et al., "Minority Carrier Lifetime and Radiation Damage Coefficients of Germanium", Conference Record of the Thirty-First IEEE, Photovoltaic Specialists Conference, Jan. 3-7, 2005, pp. 842-845.
Yoon et al., "Ultrathin silicon solar microcells for semitransparent, mechanically flexible and microconcentrator module designs", Nat. Mater., 2008, 7:907-915.
Yu et al., "Silicon Nanowires: Preparation, Device Fabrication, and Transport Properties", J. Phys. Chem. B 2000, 104, 11864-11870.
Yu et al., "Large-area blown bubble films of aligned nanowires and carbon nanotubes", Nat. Nanotechnol., 2007, 2 (6) 372-377.
Zach et al., "Synthesis of Molybdenum Nanowires with Millimeter-Scale Lengths Using Electrochemical Step Edge Decoration", Chem. Mater. 2002, 14, 3206-3216.
Zhu et al., "Optical Absorption Enhancement in Amorphous Silicon Nanowire and Nanocone Arrays", Nano Letters, 2009, vol. 9, No. 1, 279-282.
Kayes, B. et al., "Comparison of the device physics principles of planar and radial p-n junction nanorod solar cells", J. of Applied Physics, vol. 45, No. 11, p. 1228, 2005.
Amra, C., "From light scattering to the microstructure of thin-film multilayers", Applied Optics, vol. 32, No. 28, p. 5481 (1993).

(56) References Cited

OTHER PUBLICATIONS

Mohan et al., "Controlled growth of highly uniform, axial/radial direction-defined, individually addressable InP nanowire arrays", Nanotechnology 16 (2005) 2903-2907.
Morales et al., "A Laser Ablation Method for the Synthesis of Crystalline Semiconductor Nanowires", Science, 79, 208-211 (1998).
Morin et al., "Biomimetic Assembly of Zinc Oxide Nanorods onto Flexible Polymers", J. Am. Chem. Soc., 2007, 129 (45), 13776-13777.
Muskens et al., "Design of Light Scattering in Nanowire Materials for Photovoltaic Applications", Nano Letters, 2008, vol. 8, No. 9, 2638-2642.
Oh, Je Uk, Search Report and Written Opinion issued in PCT/US2010/058314, Korean Intellectual Property Office, dated Aug. 12, 2011.
Oh, Je Uk, Search Report and Written Opinion issued in PCT/US2011/029663, Korean Intellectual Property Office, dated Jan. 10, 2012.
Park, Jae Hun, Search Report for PCT/US2008/070495, Korean Intellectual Property Office, dated Feb. 20, 2009.
Park, Jae Hun, Written Opinion for PCT/US2008/070495, Korean Intellectual Property Office, dated Feb. 20, 2009.
Park, Jae Hun, Search Report for PCT/US2008/070523, Korean Intellectual Property Office, dated Feb. 20, 2009.
Park, Jae Hun, Written Opinion for PCT/US2008/070523, Korean Intellectual Property Office, dated Feb. 20, 2009.
Park, Jae Hun, Search Report for PCT/US2008/070518, Korean Intellectual Property Office, dated Feb. 20, 2009.
Park, Jae Hun, Written Opinion for PCT/US2008/070518, Korean Intellectual Property Office, dated Feb. 20, 2009.
Paulson et al., "Spectroscopic ellipsometry investigation of optical and interface properties of CdTe films deposited on metal foils", Solar Energy Materials & Solar Cells, 82 (2004) 279-90.
Peng et al., "Fabrication of Large-Area Silicon Nanowire p-n Junction Diode Arrays", Adv. Mater., 2004, 16 (1), 73-76.
Peng et al., "Aligned Single-Crystalline Si Nanowire Arrays for Photovoltaic Applications", Small, 2005, 1, 1062-1067.
Plass et al., "Flexible Polymer-Embedded Si Wire Arrays", Advanced Materials, 21, 325-328, published online Nov. 14, 2008.
Pushparaj et al., "Flexible energy storage devices based on nanocomposite paper", PNAS, Aug. 21, 2007, vol. 104, No. 34, pp. 13574-13577.
Putnam et al., "Secondary Ion Mass Spectrometry of Vapor-Liquid-Solid Grown, Au-Catalyzed, Si Wires", Nano Letters, 2008, vol. 8, No. 10, 3109-3113.
Putnam, M. et al., "10 m minority-carrier diffusion lengths in Si wires synthesized by Cu-catalyzed vapor-liquid-solid growth", Applied Physics Letters, 2009, 95:163116.1-163116-3.
Raravikar et al., "Embedded Carbon-Nanotube-Stiffened Polymer Surfaces", Small, 1 (3), 317 (2005).
Ray, Jayati, First Office Action, Australian Patent Office, Application No. 2008275878, dated Nov. 14, 2012.
Rosenbluth et al., "630-mV open circuit voltage, 12% efficient n-Si liquid junction", Appl. Phys. Lett., 1985, 45, 423-425.
Rosenbluth et al., "Kinetic Studies of Carrier Transport and Recombination at the n-Silicon/Methanol Interface", Journal of the American Chemical Society, vol. 108, No. 16, Aug. 6, 1986, pp. 4689-4695.
Rosenbluth et al., "'Ideal' Behavior of the Open Circuit Voltage of Semiconductor/Liquid Junctions", 1989, 93, 3735-3740.
Routkevitch et al., "Electrochemical Fabrication of CdS Nanowire Arrays in Porous Anodic Aluminum Oxide Templates", J. Phys. Chem. 1996, 100, 14037-14047.
Routkevitch et al., "Nonlithographic Nano-Wire Arrays: Fabrication, Physics, and Device Applications", IEEE Transactions on Electron Devices, vol. 43, No. 10, 1996, pp. 1646-1658.
Sah et al., "Recombination Properties of the Gold Acceptor Level in Silicon using the Impurity Photovoltaic Effect", Phys. Rev. Lett., 1967, 40:71-72.
Sansom et al., "Controlled partial embedding of carbon nanotubes within flexible transparent layers", Nanotechnology, 19, 035302 (2008).
Sayad et al., "Determination of diffusion length in photovoltaic crystalline silicon by modelisation of light beam induced current", Superlattices and Microstructures, 45 (2009), 393-401.
Schmidt et al., "Diameter-Dependent Growth Direction of Epitaxial Silicon Nanowires", Nano Letters, 2005, vol. 5, No. 5, 931-935.
Seibt et al.,"Characterization of haze-forming precipitates in silicon", J. Appl. Physics, 1988, 63:4444-4450.
Shchetinin et al., "Photoconverters Based on Silicon-Crystal Whiskers", Translated from Izmerital'naya Teknika, No. 4, pp. 35-36, 1978.
Shimizu et al., "Synthesis of Vertical High-Density Epitaxial Si(100) Nanowire Arrays on a Si(100) Substrate Using an Anodic Aluminum Oxide Template", Advanced Materials, 19, 917-920 (2007).
Shockley et al., "Detailed Balance Limit of Efficiency of p-n Junction Solar Cells", J. of Applied Physics, vol. 32, No. 3, 1961, 510-519.
Sivakov, V. et al., "Silicon Nanowire-Based Solar Cells on Glass: Synthesis, Optical Properties, and Cell Parameters", Nano Letters, 2009, vol. 9, No. 4, 1549-1554.
Spurgeon et al., "Repeated epitaxial growth and transfer of arrays of patterned, vertically aligned, crystalline Si wires from a single Si(111) substrate", Applied Physics Letters, 2008, 93:032112-1-032112-3.
Stelzner et al., "Silicon nanowire-based solar cells", Nanotechnology, 2008, 19:295203-1-295203-4.
Struthers, J.D., "Solubility and Difusivity of Gold, Iron, and Copper in Silicon", J. Appl. Phys, 27, 1956, p. 1560.
Sunden et al., "Microwave assisted patterning of vertically aligned carbon nanotubes onto polymer substrates", J. Vac. Sci. Technol. B 24(40 Jul./Aug. 2006, pp. 1947-1950.
Sze, M., "Physics of Semiconductor Devices", 2nd Edition, Wiley, New York, 1981, p. 21.
Takayama et al., "Topographical Micropatterning of Poly(dimethylsiloxane) Using Laminar Flows of Liquids in Capillaries", Advanced Materials, 2001, 13:570-574.
Thai, Luan C., Non-Final Office Action, U.S. Appl. No. 12/176,100, USPTO, dated Jan. 6, 2010.
Tian et al., "Coaxial silicon nanowires as solar cells and nanoelectronic power sources", Nature, 2007, 449:885-889.
Tiedje, T. et al., "Limiting efficiency of silicon solar cells", IEEE Transactions on Electron Devices, 1984, ED-31: 711-716.
Touskova et al., "Preparation and characterization of CdS/CdTe thin film solar cells", Thin Solid Films, 293 (1997) 272-276.
Tsakalakos et al., "Silicon nanowire solar cells", Applied Physics Letters, 91, 2007, 233117-1-233117-3.
Tsakalakos et al., "Strong broadband optical absorption in silicon nanowire films", J. of Nanophotonics, 2007, 1 , 013552-1-013552-10.
Wagner et al., "Vapor-Liquid-Solid Mechanism of Single Crystal Growth", Applied Physics Letters, Mar. 1, 1964, vol. 4, No. 5, pp. 89-90.
Wagner et al., "The Vapor-Liquid-Solid Mechanism of Crystal Growth and Its Application to Silicon", Trans. Metal. Soc. AIME, 1965, 233 (6), 1053-1064.
Wagner et al., "Defects in Silicon Crystals Grown by the VLS Technique", J. of Applied Physics, vol. 38, No. 4, 1967, 1554-1560.

\* cited by examiner

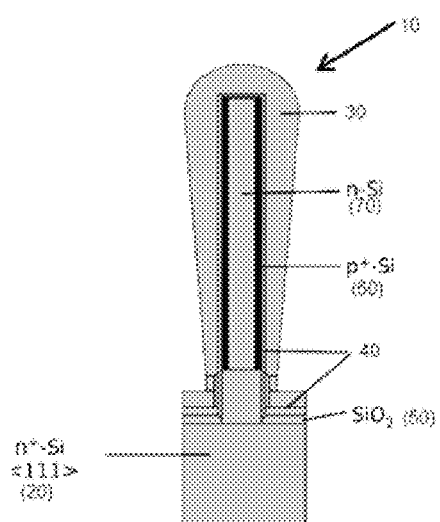 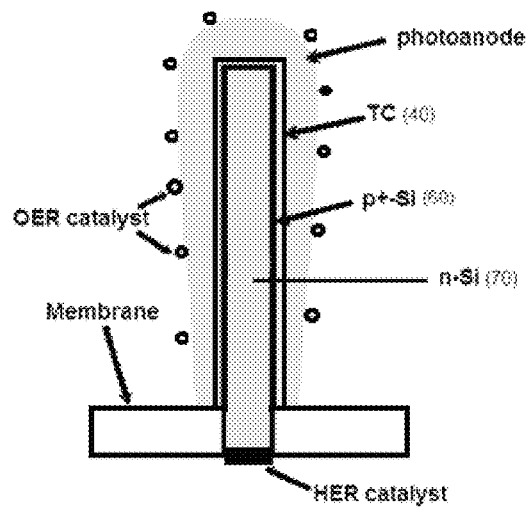
FIG. 1A  FIG. 1B
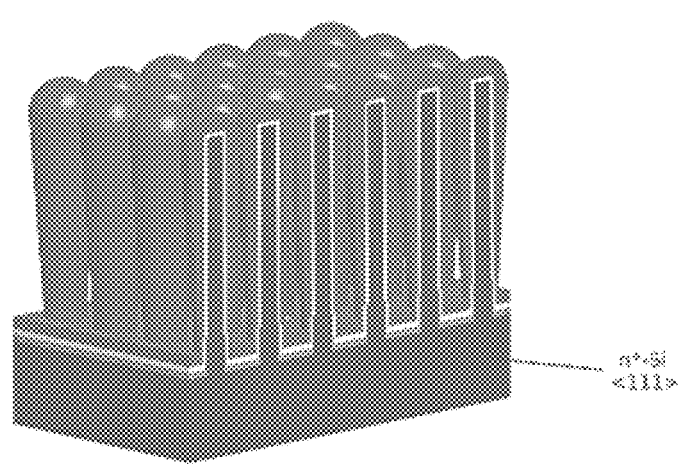 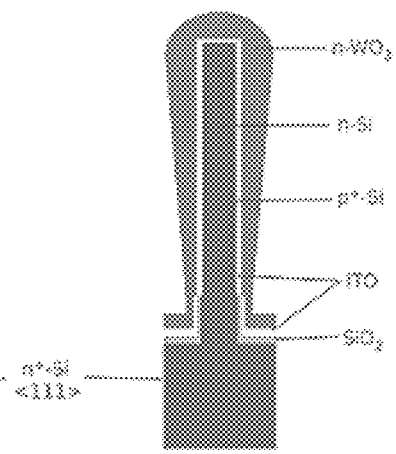
FIG. 1C  FIG. 1D
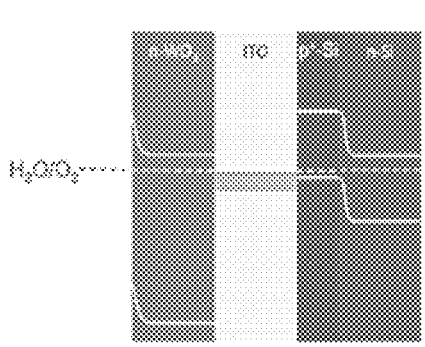 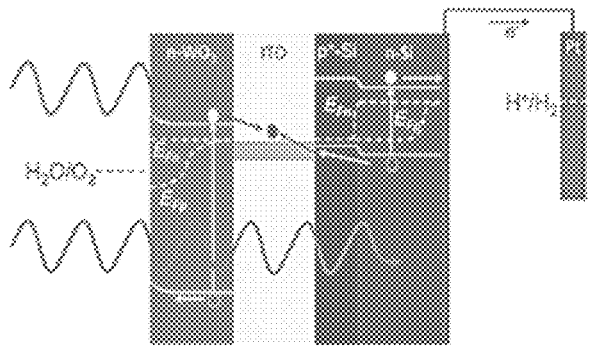
FIG. 1E  FIG. 1F

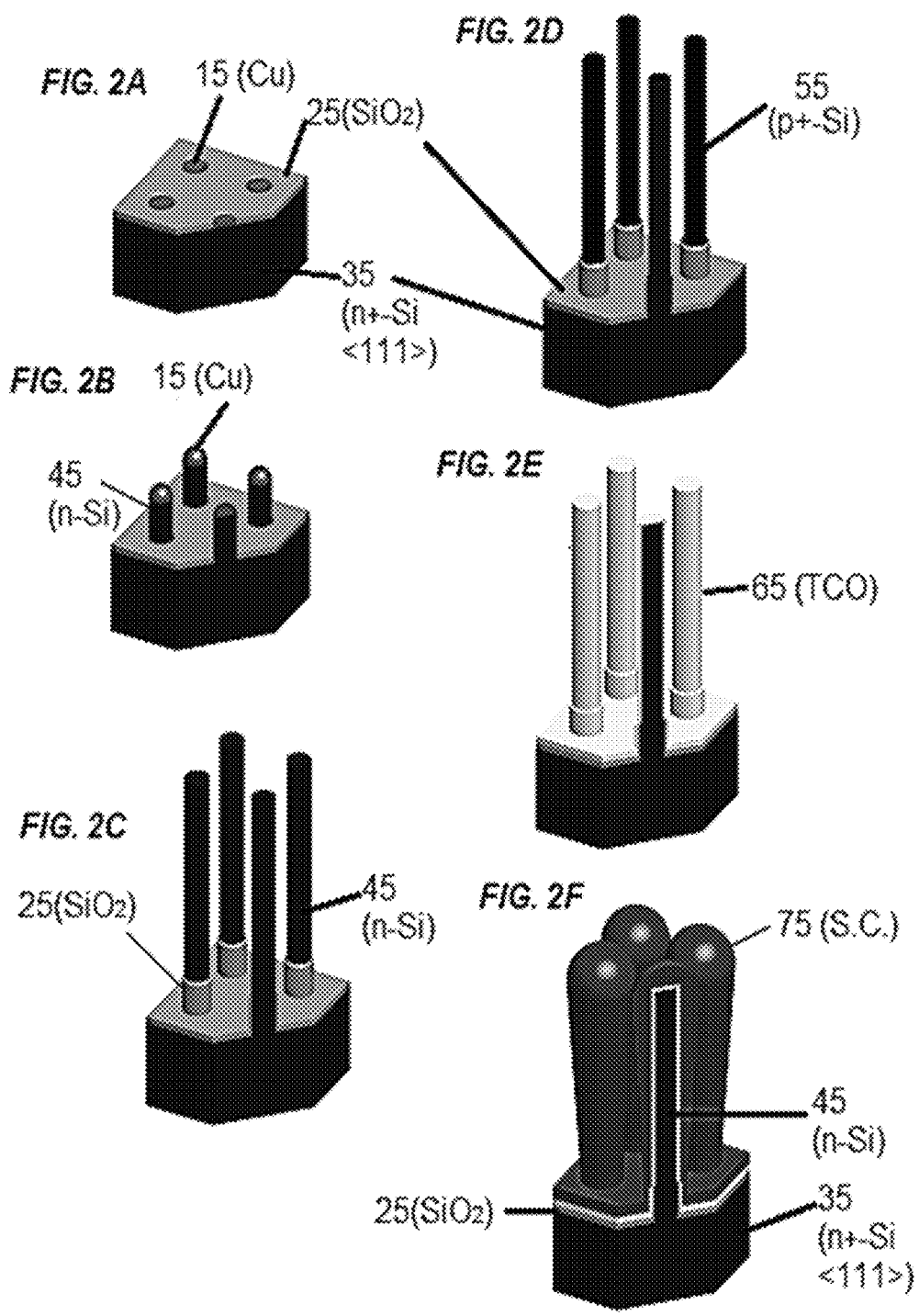

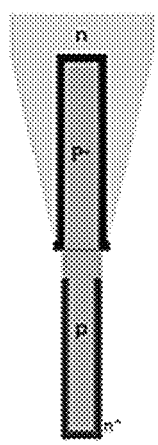 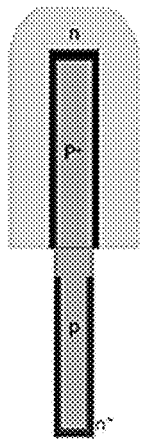 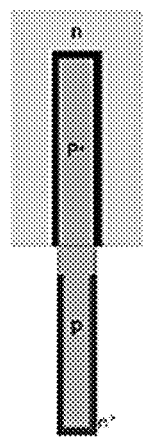 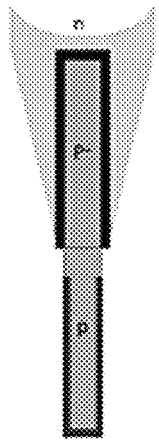
FIG. 9A    FIG. 9B    FIG. 9C    FIG. 9D
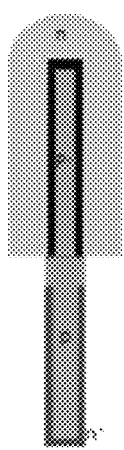  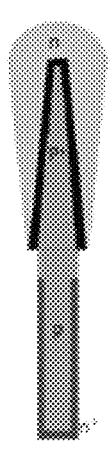 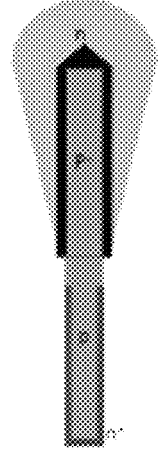 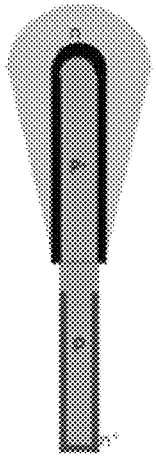
FIG. 9E    FIG. 9F    FIG. 9G    FIG. 9H    FIG. 9I
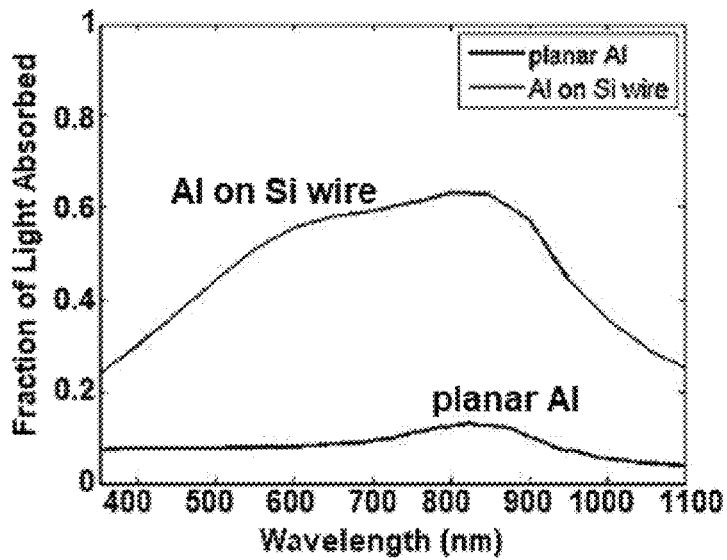
FIG. 10

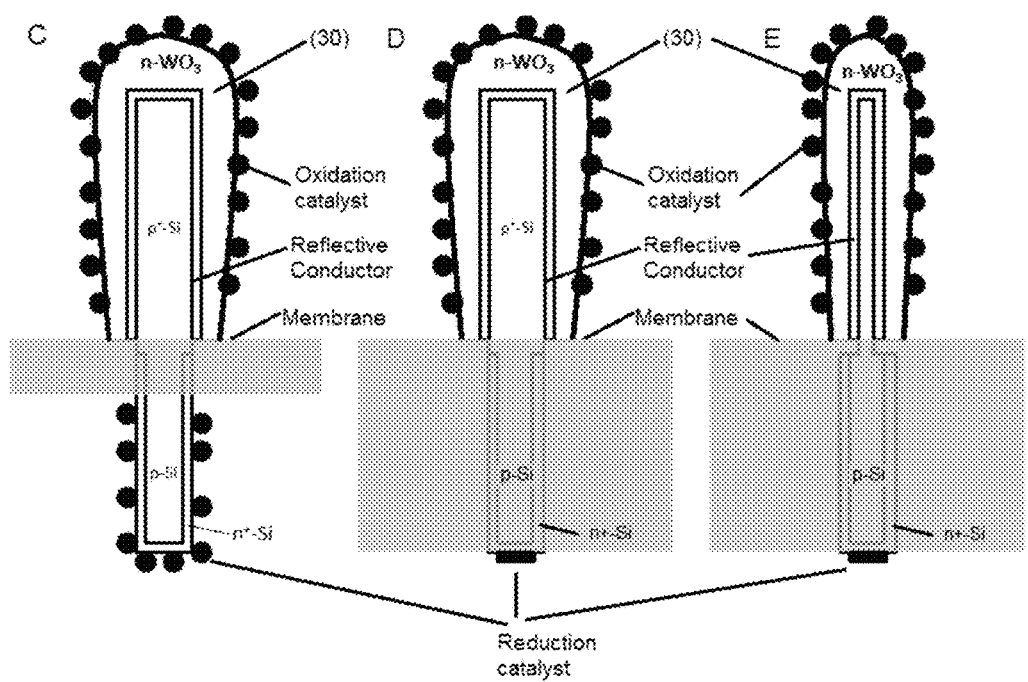
FIG. 11C-E

SEMICONDUCTOR STRUCTURES FOR FUEL GENERATION

CROSS REFERENCE TO RELATED APPLICATIONS

This application claims priority to U.S. Provisional Application Ser. No. 61/619,661, filed Apr. 3, 2012 and U.S. Provisional Application No. 61/621,819, filed Apr. 9, 2012, the disclosures of which are incorporated herein by reference.

STATEMENT REGARDING FEDERALLY SPONSORED RESEARCH

This invention was made with government support under Grant No. DE-SC0004993 awarded by the Department of Energy (JCAP). The government has certain rights in the invention.

TECHNICAL FIELD

This invention relates to photovoltaic cells, devices, water splitting devices and methods of making and using the same.

BACKGROUND

Ordered arrays of crystalline-Si (c-Si) microwires, fabricated by chemical-vapor-deposition, vapor-liquid-solid (CVD-VLS) growth mechanism, were pioneered nearly five years ago for sunlight-to-electrical power conversion. P-type Si microwire arrays, employing a thin $n^+$-doped emitter layer to form a buried junction (p-$n^+$-Si), have since realized sunlight-to-electrical power-conversion efficiencies >7% from solid-state photovoltaic (PV) devices, and >5% power-conversion efficiency toward $H_2$ evolution from acidic aqueous electrolytes when functionalized with Pt electrocatalysts. In the absence of additional processing-intensive steps for light absorption enhancement, these devices demonstrated a short-circuit (maximum) current density ($j_{sc}$)≈9 mA/cm², open-circuit (maximum) photovoltage ($V_{oc}$)≈0.53 V, and fill factor≈70%. The product of these three terms determines the power-conversion efficiency of the device. The Si microwire geometry uses ~5% of the material required for conventional wafer-based photovoltaics (PVs) and absorbs ~20% of above bandgap sunlight. Various designs to alter the path of light and increase absorption by the Si microwire arrays, and thus $j_{sc}$ and the efficiency, have been investigated with modest success.

Si microwire array photocathodes have been shown to generate photovoltages in excess of 500 mV in acidic aqueous environments, and provide a desirable geometry, relative to planar structures, for devices that effect the unassisted generation of fuels from sunlight. Microwire arrays benefit from orthogonalization of the directions of light absorption and minority-carrier collection, as well as from light-trapping effects, an increased surface area for catalyst loading per unit of geometric area, a small solution resistance as compared to planar designs, a reduced material usage through reusable substrates; and from the ability to embed the microwires into ion exchange membranes that exhibit little permeability to $H_2$ and $O_2$, thereby producing flexible devices that persistently separate the products of the water-splitting reaction.

However, the voltage generated from single-junction Si microwire arrays is much lower than the 1.23 V required for solar-driven water splitting.

SUMMARY

The disclosure provides an elongated structure comprising a plurality of radially-integrated tandem junctions separated by a transparent low resistance layer, wherein a first junction comprises a first semiconductive material and at least a second junction comprises a second different or the same semiconducting material having a different or the same band gap compared to the first semiconductive material. In one embodiment, the first junction and second junction are separated by a low resistance layer comprising a transparent conductive oxide. In one embodiment, the low resistance layer comprises one or more of a material selected from the group consisting of $TiO_2$, $CaTiO_3$, $SrTiO_3$, $Sr_3Ti_2O_7$, $Sr_4Ti_3O_{10}$, $Rb_2La_2Ti_3O_{10}$, $Cs_2La_2Ti_3O_{10}$, $CsLa_2Ti_2NbO_{10}$, $La_2TiO_5$, $La_2Ti_3O_9$, $La_2Ti_2O_7$, $La_2Ti_2O_7$:Ba, $KaLaZr_{0.3}Ti_{0.7}O_4$, $La_4CaTi_5O_{17}$, $KTiNbO_5$, $Na_2Ti_6O_{13}$, $BaTi_4O_9$, $Gd_2Ti_2O_7$, $Y_2Ti_2O_7$, $ZrO_2$, $K_4Nb_6O_{17}$, $Rb_4Nb_6O_{17}$, $Ca_2Nb_2O_7$, $Sr_2Nb_2O_7$, $Ba_5Nb_4O_{15}$, $NaCa_2Nb_3O_{10}$, $ZnNb_2O_6$, $Cs_2Nb_4O_{11}$, $La_3NbO_7$, $Ta_2O_5$, $KsPrTa_5O_{15}$, $K_3Ta_3Si_2O_{13}$, $K_3Ta_3B_2O_{12}$, $LiTaO_3$, $KTaO_3$, $AgTaO_3$, $KTaO_3$:Zr, $NaTaO_3$:La, $NaTaO_3$:Sr, $Na_2Ta_2O_6$, $CaTa_2O_6$, $SrTa_2O_6$, $NiTa_2O_6$, $Rb_4Ta_6O_{17}$, $Ca_2Ta_2O_7$, $Sr_2Ta_2O_7$, $K_2SrTa_2O_7$, $RbNdTa_2O_7$, $H_2La_{2/3}Ta_2O_7$, $K_2Sr_{1.5}Ta_3O_{10}$, $LiCa_2Ta_3O_{10}$, $KBa_2Ta_3O_{10}$, $Sr_5Ta_4O_{15}$, $Ba_2Ta_4O_{15}$, $H_{1.8}Sr_{0.81}Bi_{0.19}Ta_2O_7$, Mg—Ta Oxide, $LaTaO_4$, $LaTaO_7$, $PbWO_4$, $RbWNbO_6$, $RbWTaO_6$, $CeO_2$:Sr, $BaCeO_3$, $NaInO_2$, $CaIn_2O_4$, $SrIn_2O_4$, $LaInO_3$, $Y_xIn_{2-x}O_3$, $NaSbO_3$, $CaSb_2O_6$, $Ca_2Sb_2O_7$, $Sr_2Sb_2O_7$, $Sr_2SnO_4$, $ZnGa_2O_4$, $Zn_2GeO_4$, $LiInGeO_4$, $Ga_2O_3{}^b$, $Ga_2O_3$:$Zn^c$, $Na_2Ti_3O_7$, $K_2Ti_2O_5$, $K_2Ti_4O_9$, $Cs_2Ti_2O_5$, $H^+$—$Cs_2Ti_2O_5$, $Cs_2Ti_5O_{11}$, $Cs_2Ti_6O_{13}$, $H^+$—$CsTiNbO_5$, $H^+$—$CsTi_2NbO_7$, $SiO_2$-pillared $K_2Ti_4O_9$, $SiO_2$-pillared $K_2Ti_{2.7}Mn_{0.3}O_7$, $Na_2W_4O_{13}$, $H^+$—$KLaNb_2O_7$, $H^+$—$RbLaNb_2O_7$, $H^+$—$CsLaNb_2O_7$, $H^+$—$KCa_2Nb_3O_{10}$, $SiO_2$-pillared $KCa_2Nb_3O_{10}$, ex-$Ca_2Nb_3O_{10}$/$K^+$ nanosheet[4], Restacked ex-$Ca_2Nb_3O_{10}$/$Na^+$, $H^+$—$RbCa_2Nb_3O_{10}$, $H^+$—$CsCa_2Nb_3O_{10}$, $H^+$—$KSr_2Nb_3O_{10}$, $H^+$—$KCa_2NaNb_4O_{13}$, $Bi_2W_2O_9$, $Bi_2Mo_2O_9$, $Bi_4Ti_3O_{12}$, $BaBi_4Ti_4O_{15}$, $Bi_3TiNbO_9$, $PbMoO_4$, $(NaBi)_{0.5}MoO_4$, $(AgBi)_{0.5}MoO_4$, $(NaBi)_{0.5}WO_4$, $(AgBi)_{0.5}WO_4$, $Ga_{1.14}In_{0.86}O_3$, $\beta$-$Ga_2O_3$, $Ti_{1.5}Zr_{1.5}(PO_4)_4$, $WO_3$, $Bi_2WO_6$, $Bi_2MoO_6$, $Bi_2Mo_3O_{12}$, $Zn_3V_2O_8$, $Na_{0.5}Bi_{1.5}VMoO_8$, $In_2O_3$ $(ZnO)_3$, $SrTiO_3$:Cr/Sb, $SrTiO_3$:Ni/Ta, $SrTiO_3$:Cr/Ta, $SrTiO_3$:Rh, $CaTiO_3$:Rh, $La_2Ti_2O_7$:Cr, $La_2Ti_2O_7$:Fe, $TiO_2$:Cr/Sb, $TiO_2$:Ni/Nb, $TiO_2$:Rh/Sb, $PbMoO_4$:Cr, $RbPb_2Nb_3O_{10}$, $PbBi_2Nb_2O_9$, $BiVO_4$, $BiCu_2VO_6$, $BiZn_2VO_6$, $SnNb_2O_6$, $AgNbO_3$, $Ag_3VO_4$, $AgLi_{1/3}Ti_{2/3}O_2$, $AgLi_{1/3}Sn_{2/3}O_2$, $LaTiO_2N$, $Ca_{0.25}La_{0.75}TiO_{2.25}N_{0.75}$, TaON, $Ta_3N_5$, $CaNbO_2N$, $CaTaO_2N$, $SrTaO_2N$, $BaTaO_2N$, $LaTaO_2N$, $Y_2Ta_2O_5N_2$, $TiN_xO_yF_z$, $Sm_2Ti_2O_5S_2$, La—In oxysulfide, GaAs, GaP, $GaAs_xP_{1-x}$, $Al_xGa_{1-x}$, As, $Al_xGa_{1-x}As_yP_{1-y}$, $In_xGa_{1-x}As$, $In_xGa_{1-x}P$, $In_xGa_{1-x}As_yP_{1-y}$, $Al_xIn_{1-x}As_yP_{1-y}$, $Al_xGa_{1-x}As_yN_zP_{1-y-z}$, $In_xGa_{1-x}As_yN_zP_{1-y-z}$, $Zn_3P_2$, $Zn_3S_2$, and $ZnP_xS_{1-x}$, (0≤x≤1, 0≤y≤1, 0≤z≤1, 0≤y+z≤1). In one embodiment, the second semiconductive layer comprises a material selected from the group consisting of GaAs, GaP, $GaAs_xP_{1-x}$, $Al_xGa_{1-x}$, As, $Al_xGa_{1-x}As_yP_{1-y}$, $In_xGa_{1-x}As$, $In_xGa_{1-x}P$, $In_xGa_{1-x}As_yP_{1-y}$, $Al_xIn_{1-x}As_yP_{1-y}$, $Al_xGa_{1-x}As_yN_zP_{1-y-z}$, $In_xGa_{1-x}As_yN_zP_{1-y-z}$, $Zn_3P_2$, $Zn_3S_2$, and $ZnP_xS_{1-x}$ (0≤x≤1, 0≤y≤1, 0≤z≤1, 0≤y+z≤1). In another embodiment, the low resistance layer comprises indium tin oxide (ITO). In yet another embodiment, the elongated structure has a dimension comprising 500 nm to about 10 micrometers in diameter and about 1 micrometer to 1 mm in length or wherein the elongated structure has a mean diameter less than 1 micrometer and a length of less than 1 micrometer and an aspect ratio of greater than 1. In yet another embodiment, the elongated structure has an aspect ratio greater than 1. In one embodiment, the first semiconductive material is Si. In another embodiment, the elongated structure is substantially embedded in a material selected from the group consisting of glass, polymer and wax. In yet a further embodiment, the material forms a membrane comprising the elongated structure embedded in the material extending from and/or through a first surface to and/or through a second surface of the membrane. In one embodiment, one or both ends of the elongated structure are coated with a catalyst. In yet another embodiment, the first conductive material and/or the second conductive material are designed geometrically to optimize light incidence or collection at one or both of the materials. In a further embodiment, the tops of the elongated structures are flat. In yet another embodiment, the first semiconductive layer comprises a material selected from the group consisting of crystalline Si, multicrystalline Si, GaAs, InP, CdTe and alloys of any of the foregoing, or group IV metal dichalcogenides; the low resistance layer comprise a material selected from the group consisting of ITO (In—$SnO_2$), FTO (F-doped $SnO_2$), and $TiO_2$; and the second semiconductive layer comprises a material selected from the group consisting of $WO_3$, BiVO4, $Fe_2O_3$, GaP, CdSe, and amorphous-Si. In a further embodiment, the group IV metal dichalcogenides is selected from the group consisting of $MoS_2$, $WS_2$, $MoSe_2$, and $WSe_2$.

The disclosure also provides a method of making the structures described above, comprising: (a) fabricating a first semiconductive structures on a Si substrate comprising (i) forming a templated oxide layer on the substrate, wherein the template for the templated oxide layer comprises openings in the oxide layer for the formation of a first semiconductive structure; and (ii) growing a set of first semiconductive structures on the substrate, wherein the first semiconductive structure growth is supported by a catalyst deposited in the openings in the oxide layer; (b) coating the fabricated first semiconductive structures in an oppositely doped semiconductive material layer to generate an emitter layer; (c) coating the emitter layer with an transparent low resistance layer; and (d) radially and epitaxially applying a second semiconductive material on the transparent low resistance layer, wherein the second semiconductive material has the same or wider band-gap as the first semiconductive material. In one embodiment, the low resistance layer comprises a semiconductive material. In another embodiment, the low resistance layer comprises a transparent conductive oxide. In yet another embodiment, the transparent conductive oxide is selected from the group consisting of cadmium tin oxide (CTO), indium tin oxide (ITO), fluorine-doped tin oxide (SnO:F or FTO), indium-doped cadmium-oxide, cadmium stannate ($Cd_2SnO_4$ or CTO), doped zinc oxide (ZnO), such as aluminum-doped zinc-oxide (ZnO:Al or AZO), indium-zinc oxide (IZO), zinc tin oxide ($ZnSnO_x$), and combinations thereof. In yet another embodiment, the elongated structure is substantially embedded in a wax, glass or polymer. In yet another embodiment, the embedded elongated structure are mechanically removed from the Si substrate. In still another embodiment, the method further comprises applying a hydrogen evolving and/or oxygen evolving catalyst to the elongated structure. In a further embodiment, the catalyst is selected from the group consisting of Pt, Co, Cu, Fe, $MoS_x$ where x is nominally 2, or a sub or super-stoichiometric, Ni, CoMo, CoW, FeMo, NiCo, NiFe, NiFeC, NiFeS, NiMnS, NiMo, NiMoP, NiSn, NiW, NiZn, NiZnP, CoNiFe, NiCoPMo, NiMoCo, NiMoCu, NiMoFe, NiMoW, NiSiMo, NiSiW, NiWPCu, $IrO_x$ where x is nominally 2, or sub or super-stoichiometric, Pt, Co, Co/$(PO_4)^{3-}$, Co/$(BO_3)^{3-}$, CoP, Cu, Fe, Mn, Ni, Ni/$(BO_3)^{3-}$, NiP, Pb, CoFe, $CoPSc_2O_3$, FeMn, NiCo, NiCr, NiCu, NiFe, NiLa, NiLa, $NiPSc_2O_3$, NiSn, NiZn and NiMoFe.

The disclosure also provides a solar cell or photoelectrosynthetic device comprising the structure of any embodiment described herein. In one embodiment, the device comprises: a substrate; an ordered array of elongate semiconductor structures comprising at least 2 different semiconductive materials axially and radially integrated, wherein the elongate semiconductor structures have length dimensions defined by adjacent ends in electrical contact with at least portions of the substrate and distal ends not in contact with the substrate and have radial dimensions generally normal to the length dimensions and the radial dimensions are less than the length dimensions; a transparent low resistive layer separating the at least 2 different semiconductive materials; and wherein the device absorbs received light and converts it into electricity or chemical energy. In one embodiment, the elongated semiconductor structures comprise wires. In another embodiment, the elongate semiconductor structures are embedded in a matrix. In yet another embodiment, the matrix is a glass, polymer or wax. In yet a further embodiment, the elongate semiconductor structures are partially or fully embedded in a matrix.

BRIEF DESCRIPTION OF THE DRAWINGS

FIG. 1A-F shows a device schematic of the disclosure. (a) shows a schematic of a single tandem junction wire of the disclosure. (b) shows another schematic of a single tandem junction wire of the disclosure and includes a membrane and OER and HER catalysts. (c) Tandem junction microwire array with a buried, homo-junction (n-$p^+$-Si) coated by ITO and n-$WO_3$. (d) 2D cross-section of an individual tandem junction array unit cell. (e) Electronic structure of tandem device in the dark showing the buried n-$p^+$-Si junction, ohmic Si/ITO/n-$WO_3$ junction, and n-$WO_3$/liquid junction. The device is shown equilibrated with the oxygen evolution potential. (f) Steady-state electronic structure of tandem device under illumination with carrier movement directions shown. Both the oxygen and hydrogen evolution potentials are shown with the overpotentials accounted for by the difference between the respective quasi-Fermi level and reaction potential. Electrons and holes are collected radially in the n-$WO_3$. Holes are collected radially in the n-$p^+$-Si and electrons are collected axially at the back contact.

FIG. 2A-F shows a tandem junction fabrication method of the disclosure. (a) photolithographically patterned $n^+$-Si <111> wafer with a $SiO_2$ mask layer and Cu catalyst in the desired growth pattern. (b) VLS Cu-catalyzed growth of n-type Si microwires on $n^+$-Si substrate followed by a metal etch (RCA 2). (c) $SiO_2$ reaction barrier (boot) formation via $SiO_2$ growth, partial polydimethylsiloxane (PDMS) infill, HF etch and PDMS removal. (d) $p^+$-Si emitter drive-in from $BCl_3$ precursor at 950° C. for 30 min in a CVD furnace. (e) Conformal DC sputter coating of ITO. (f) Conformal n-$WO_3$ electrodeposition and annealing at 400° C. for 2 h.

FIG. 9A-I show nine diagrams of design modifications with an opaque contact, aiming to understand and decrease contact absorption losses; not to scale; A) elimination of the round top; B) elimination of the tapered sides; C) combination of A and B; D) convex-shaped WO$_3$ top; E) smaller radius in the top half of the wire; F) similar to E but with the WO$_3$ layer flush with the bottom half of the silicon wire; G) elimination of the top Al surface; H) pyramidal Al top surface; I) Rounded top of Si and Al.

FIG. 10 shows a plot of aluminum absorption vs. wavelength for a planar substrate and an Al coated Si wire.

FIG. 11A-E shows devices of the disclosure. (A) shows a photoactive (not low resistance) junction can be a semiconductor-liquid junction (at n-WO$_3$|solution.). The other junction is not a semiconductor-liquid junction (at n-Si and p$^+$-Si. The photoactive semiconductor regions (both labeled on the materials) are doped the same (e.g., n-type in this embodiment). (B) Both photoactive junctions can be semiconductor-liquid junctions (at n-WO$_3$|solution and p-Si solution). The photoactive semiconductor regions (both labeled on the materials) are doped opposite. The conductor could be non-transparent, especially if the p-Si is p$^+$-Si; if the top is p$^+$-Si, the conductor is non-transparent and highly reflective to bounce light around to the bottom p-Si; p$^+$-Si, with a reflective layer, is another embodiment and is included in the alternative designs. (C) A buried pn$^+$ junction can be formed at the bottom affording the largest voltages regardless of the catalyst work function. (D) The membrane is thicker for mechanical stability; the bottom junction is buried, however then the reduction catalyst can be a solid layer like in (A) (above). (E) The p$^+$-Si region is extremely thin (e.g., about 10 to 100s of nanometers in diameter. In all of A-E the reflective conductor is also as thin as possible so that the incident light can more easily see the bottom Si. The H$_2$ evolution catalyst is a reductive catalyst, in general. The O$_2$ evolution catalyst is an oxidative catalyst, in general. The dopant configuration can be switched, but all doped regions are switched and the catalysts are switched.

DETAILED DESCRIPTION

Figure 3A:
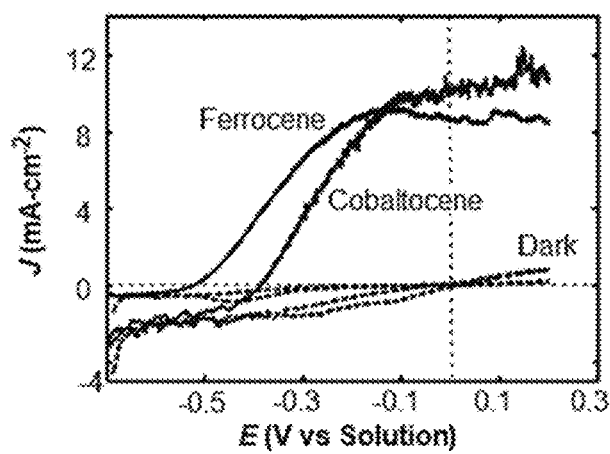
FIG. 3A-C shows non-aqueous n-$p^+$-Si buried junction performance. (a) Non-aqueous PEC (forward scan, scan rate=20 mV·$s^{-1}$) results using ferrocene$^{+/0}$ (black) and cobaltocene$^{+/0}$ (blue) as redox couples to probe the n-$p^+$-Si buried junction performance in microwires arrays. The dark scans are dashed lines and light scans are shown as solid lines. (b) SEM image near the base of the Si microwire devices that displays the SiO$_2$ boot. (c) Redox potentials of cobaltocene ((Cp)$_2$Co$^{+/0}$) and ferrocene) ((Cp)$_2$Fe$^{+/0}$) with respect to the potentials of the conduction band edge and the valence band edge of Si.
Figure 3B:
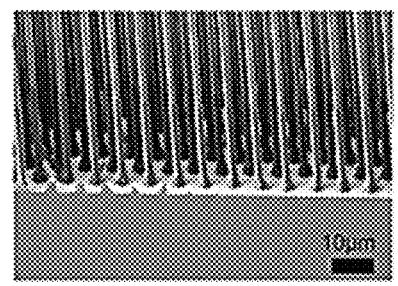
Figure 3C:
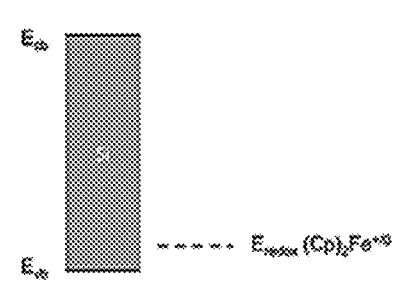
Figure 4A:
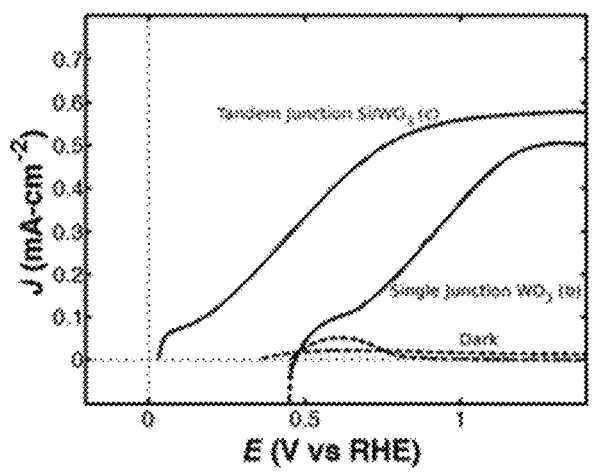
FIG. 4A-C shows aqueous single (WO$_3$/liquid junction) and tandem junction device performance. (a) Three electrode PEC (forward scan, scan rate=20 mV-s$^{-1}$) performance for single (blue) and tandem (black) junction microwire devices in contact with 1.0 M H$_2$SO$_4$(aq). The single junction microwire device consisted of WO$_3$ supported on p-Si microwires that had been coated with ITO. Here the p-Si/ITO contact is ohmic so the only rectifying junction is at the WO$_3$/liquid junction. These data demonstrate the presence of an additive voltage from each junction, with 0.73 V and 0.5 V produced by the WO$_3$/liquid and n-p$^+$-Si buried junctions, respectively. The V$_{oc}$ for the single junction device was defined as the point at which the dark current, due to capacitive charging, and the illuminated current separated. The V$_{oc}$ for the tandem junction device was defined as the point at which no current was flowing because no positive dark current existed in this region. (b) SEM image of p-Si/ITO/WO$_3$ single junction microwire devices. (c) SEM image of tandem junction devices.
Figure 4B:
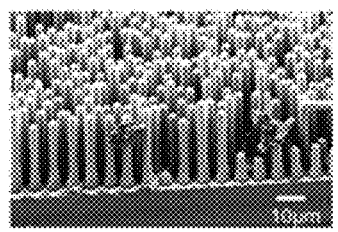
Figure 4C:
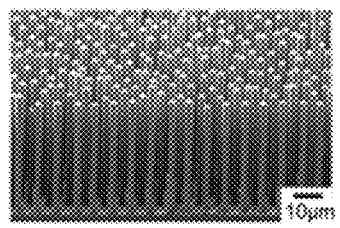
Figure 5A:
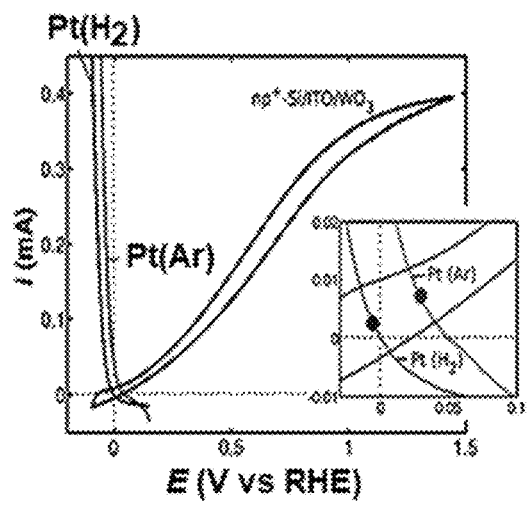
FIG. 5A-B shows load-line analysis and two electrode performance. (a) J-E curves and load-line analysis of the tandem junction (n-p$^+$-Si/ITO/WO$_3$) microwire device at 11 suns plotted against the dark HER curves (mirrored about the abscissa) using a Pt disc electrode in an Ar(g)- or H$_2$(g)-saturated solution. These measurements were conducted in a two-electrode cell with 1 M H$_2$SO$_4$ in both compartments separated by a Nafion® membrane to maintain product separation. The Pt disc HER curves include solution and membrane resistances because the reference electrode (SCE) was placed in the opposite cell at the same location used for the tandem microwire array device. The inset is a zoomed in view around the operational points, which are indicated by the red (Ar) and blue (H$_2$) circles. (b) Two-electrode measurements at 0 V applied bias between the tandem junction device (11 Suns illumination) and Pt disc electrode in either Ar(g)- or H$_2$(g)-saturated solution. Turning the light off, as indicated, demonstrated that the positive current was photoinduced.
Figure 5B:
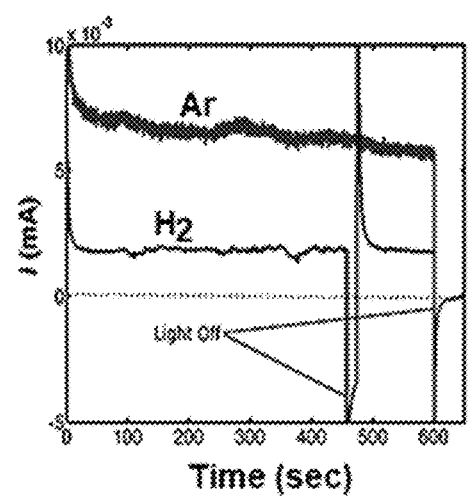
Figure 6A:
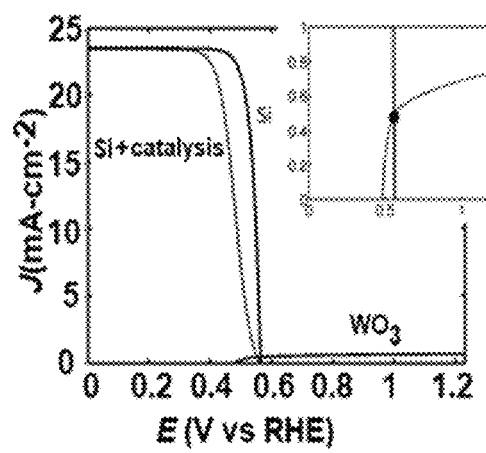
FIG. 6A-B shows modeled tandem junction performance. Modeled J-E curves and load-line analysis for unconcentrated (a) and concentrated (b) illumination conditions that match the experimental photon fluxes at 1 and 12 Suns. The Si homo-junction is shown with (green) and without (black) inclusion of realistic hydrogen evolution catalytic overpotentials. Butler-Volmer kinetics with α=1 and j$_0$=10$^{-3}$ A-cm$^{-2}$ was used to calculate the catalytic overpotentials in the absence of mass transport limitations. The insets show the operating point for unconcentrated illumination ((a) black dot) and for concentrated illumination, with ((b) green dot) and without ((b) black dot) overpotential due to HER catalysis included. The rate of catalysis is not expected to affect the WO$_3$ J-E behavior due to the large band gap of WO$_3$ and proximity of E$^{o'}$(O$_2$/H$_2$O) to the potential of the conduction band of WO$_3$.
Figure 6B:
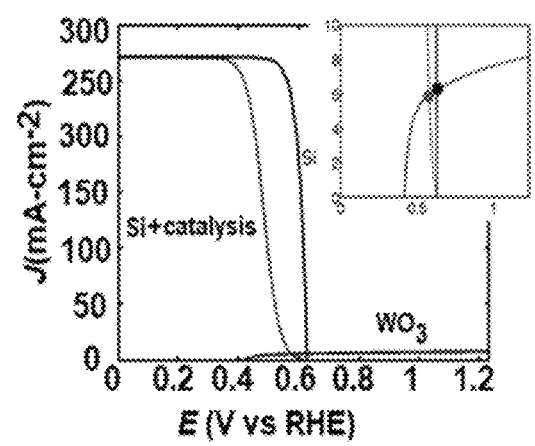

As used herein and in the appended claims, the singular forms "a," "and," and "the" include plural referents unless the context clearly dictates otherwise. Thus, for example, reference to "a pillar" includes a plurality of such pillars and reference to "the catalyst" includes reference to one or more catalysts known to those skilled in the art, and so forth.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of:"

Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein.

The publications discussed above and throughout the text are provided solely for their disclosure prior to the filing date of the present application. Nothing herein is to be construed as an admission that the inventors are not entitled to antedate such disclosure by virtue of prior disclosure.

By "about" is meant a quantity, level, value, number, frequency, percentage, dimension, size, amount, weight or length that varies by as much as 30, 25, 20, 15, 10, 9, 8, 7, 6, 5, 4, 3, 2 or 1% to a reference quantity, level, value, number, frequency, percentage, dimension, size, amount, weight or length. With respect to ranges of values, the disclosure encompasses each intervening value between the upper and lower limits of the range to at least a tenth of the lower limit's unit, unless the context clearly indicates otherwise. Further, the invention encompasses any other stated intervening values. Moreover, the invention also encompasses ranges excluding either or both of the upper and lower limits of the range, unless specifically excluded from the stated range.

The term "array" generally refers to multiple numbers of structures distributed within an area and spaced apart, although possible touching in some places, unless otherwise indicated. Structures within an array all do not have to have the same orientation.

The term "aspect ratio" refers to the ratio of a structure's length to its width. Hence, the aspect ratios of the elongate structures will be greater than one. In various embodiments, the diameter of, for example, a "rod" or "wire" is about 10-50 nm, about 50-100 nm, about 100-500 nm, about 500 nm-1 µm, about 1 µm-10 µm or about 10µ-100 µm. Typically the diameter will be about 1-10 µm. The length of the "rod" or "wire" is about 1 µm-10 µm, about 10 µm-100 µm, or about 100 µm-several millimeters.

The terms "ball," "spheroid," "blob" and other similar terms may also be used synonymously, except as otherwise indicated. Generally, these terms refer to structures with the width defined by the longest axis of the structure and the length defined by the axis generally normal to the width. Hence, the aspect ratio of such structures will generally be unity or less than unity.

As used herein, "elongated structure" refers to a structure having an aspect ratio greater than 1 wherein the structure can be uniform or non-uniform along its axis. For example, the elongated structure can be conical, hour-glass, an inverted conical, and the like. The elongated structure has one axis that is longer than a perpendicular axis. The longer axis can be several to about 999 nm in length (e.g., a nano-elongated structure), or may be a micron to 999 microns in length or longer (e.g., micro-elongated structures).

The terms "ordered" or "well-defined" generally refer to the placement of elements in a specified or predetermined pattern where the elements have distinct spatial relationships to one another. Hence, the terms "ordered array" or "well-defined" generally refer to structures distributed within an area with distinct, specified or predetermined spatial relationships to one another. For example, the spatial relationships within an ordered array may be such that the structures are spaced apart from one another by generally equal distances. Other ordered arrays may use varying, but specified or predetermined, spacings. The structures within "ordered" or "well-defined" arrays may also have similar orientations with respect to each other.

A "photovoltaic cell" is an electrical device comprising a semiconductor that converts light or other radiant energy, in the range from ultraviolet to infrared radiation, incident on its surface into electrical energy in the form of power/voltage/current and which has two electrodes, usually at least one diode where the diode has a top electrode and a bottom electrode with opposite electrical polarities. The photovoltaic cell produces direct current which flows through the electrodes. As employed herein, the term photovoltaic cell is generic to cells which convert radiant energy into electrical energy. A solar cell is a photocell that converts light including solar radiation incident on its surface into electrical energy.

A photovoltaic ("PV") cell may be connected in parallel, in series, or a combination thereof with other such cells. A common PV cell is a p-n junction device based on crystalline silicon. In various embodiments of the disclosure a PV cell comprises p-n junction devices of silicon elongated structure. In other embodiments a PV cell comprises a plurality of silicon p-n junctions. Other types of PV cells can be based on a p-n junction cell of silicon and other semiconductive materials, such as, but not limited to, amorphous silicon, polycrystalline silicon, germanium, organic materials, Group III-V semiconductor materials, such as gallium arsenide (GaAs), Group II-VI semiconductor materials, such as cadmium sulfide (CdS), metal oxides, nitrides, or chalcogenides, such as zinc oxide, and mixed ternary, and larger number component, materials.

During operation of a photovoltaic cell, incident solar or light radiation penetrates below a surface of the PV cell and is absorbed. The depth at which the solar radiation penetrates depends upon an absorption coefficient of the cell. In the case of a PV cell based on silicon, an absorption coefficient of silicon varies with wavelength of solar radiation. At a particular depth within the PV cell, absorption of solar radiation produces charge carriers in the form of electron-hole pairs. Electrons flow through one electrode connected to the cell, while holes exit through another electrode connected to the cell. The effect is a flow of an electric current through the cell driven by incident solar radiation. Inefficiencies exist in current solar cells due to the inability to collect/use and convert the entire incident light.

Also, in accordance with a junction design of a PV cell, charge separation of electron-hole pairs is typically confined to a depletion region, which can be limited to a thickness of about 1 µm. Electron-hole pairs that are produced further than a diffusion or drift length from the depletion region typically do not charge separate and, thus, typically do not contribute to the conversion into electrical energy. The depletion region is typically positioned within the PV cell at a particular depth below a surface of the PV cell. The variation of the absorption coefficient of silicon across an incident solar spectrum can impose a compromise with respect to the depth and other characteristics of the depletion region that reduces the efficiency of the PV cell. For example, while a particular depth of the depletion region can be desirable for solar radiation at one wavelength, the same depth can be undesirable for solar radiation at a longer wavelength. In particular, since the longer wavelength solar radiation can penetrate below the surface to a greater degree, electron-hole pairs that are produced can be too far from the depletion region to contribute to an electric current.

A photoelectrochemical (PEC) cell is a PV cell immersed in an electrolyte to impart electrochemical reactions at its surfaces. It is generally equivalent to electrically connecting a PV cell to two electrodes immersed in an electrolyte such that the electrochemical reactions are directly driven by the electricity generated by the PV. A photoelectrosynthetic (PES) cell is one where the net reactions being driven by the PV cell are thermodynamically unfavorable and thus require the free energy of the PV to perform the reactions. There are two electrochemical reactions, termed half-reactions, that occur, one at each electrode, to result in an overall balanced chemical reaction, such as the water splitting reaction which is $2H_2O \rightarrow 2H_2+O_2$.

N/P junction (or p-n or n-p) refers to a connection between a p-type semiconductor and an n-type semiconductor which produces a diode. Depletion region refers to the transition region between an n-type region and a p-type region of an N/P junction where a large electric field exists.

Electromagnetic Radiation to Electric Energy Conversion Device (EREECD) is a device that reacts with electromagnetic (optical) radiation to produce electrical energy. Optoelectronic Energy Device (OED) refers to a device that reacts with optical radiation to produce electrical energy with an electronic device. As used herein, the term "ultraviolet range" refers to a range of wavelengths from about 5 nm to about 400 nm. As used herein, the term "visible range" refers to a range of wavelengths from about 400 nm to about 700 nm. As used herein, the term "infrared range" refers to a range of wavelengths from about 700 nm to about 2 mm. The infrared range includes the "near infrared range," which refers to a range of wavelengths from about 700 nm to about 5 µm, the "middle infrared range," which refers to a range of wavelengths from about 5 µm to about 30 µm, and the "far infrared range," which refers to a range of wavelengths from about 30 µm to about 2 mm.

Within this description, the term "semiconductive material", "semiconductor" or "semiconducting substrate" and the like is generally used to refer to elements, structures, or devices, etc. comprising materials that have semiconductive properties, unless otherwise indicated. Such materials include, but are not limited to: materials including elements from Group IV of the periodic table; materials including elements from Group III and Group V of the periodic table; materials including elements from Group II and Group VI of the periodic table; materials including elements from Group I and Group VII of the periodic table; materials including elements from Group IV and Group VI of the periodic table; materials including elements from Group V and Group VI of the periodic table; and materials including elements from Group II and Group V of the periodic table. Other materials with semiconductive properties may include: layered semiconductors; metallic alloys; miscellaneous oxides; some organic materials, and some magnetic materials. The term "semiconducting structure" refers to a structure comprising, at least in part, a semiconducting material. A semiconducting structure may comprise either doped or undoped material. As described herein, the "core" or first semiconductive material can be any semiconductive material. In certain embodiments, the "core" is a Si material.

Further the term "vertical" with reference to elongated structures, wires, rods, whiskers, pillars, etc., generally refers to structures that have a length direction that is elevated somewhat from horizontal.

The term "vertical alignment" generally refers to an alignment or orientation of a structure or structures that is elevated from horizontal. The structure or structures do not have to be completely normal to horizontal to be considered to have a vertical alignment.

The terms "vertically aligned array" or "vertically oriented array" generally refer to arrays of structures where the structures have orientations elevated from a horizontal orientation up to orientations completely normal to a horizontal orientation, but the structures within the array may or may not have all the same orientations with respect to horizontal.

The term "wider band-gap" refers to the difference in band-gaps between a first sub-cell (or first material) and a second sub-cell (or second material). "Band-gap" or "energy band gap" refers to the characteristic energy profile of a semiconductor that determines its electrical performance, current and voltage output, which is the difference in energy between the valence band maximum and the conduction band minimum. For example, in one embodiment, reference to an elongated structure coated with a material having a "wider band-gap material" refers to a material having a wider band-gap than the elongated structure's material. To drive the water splitting reaction at reasonable overpotentials, ideally the core semiconductive material has a bandgap energy of about 1.1 eV and the outer/radial semiconductive material has an eV of about 1.7 eV.

Within this description, the terms "wires," "rods," "whiskers," and "pillars" and other similar terms may be used synonymously, except as otherwise indicated. Generally, these terms refer to elongate structures which have lengths and widths, where the length is defined by the longest axis of the structure and the width is defined by the axis generally normal to the longest axis of the structure. In various embodiments, the diameter of, for example, a "rod" is about 10-50 nm, about 50-100 nm, about 100-500 nm, about 500 nm-1 µm, about 1 µm-10 µm or about 10µ-100 µm. Typically the diameter will be about 1-10 µm. The length of the, for example, "rod" is about 1 µm-10 µm, about 10µ-100 µm, or about 100 µm-several millimeters.

Integrated solar fuels generation devices are of interest to provide chemical energy sources rather than purely electrical energy. In other words, solar cells convert light energy to electrical energy that can be stored or used directly. However, other means to store light energy look to convert the light energy into chemical energy through splitting various chemical to produce $H_2$. Optimization of various aspects of the components including the semiconductive material, geometry, membranes and flow systems are needed. Tandem semiconductive materials are particularly of interest due to the ability to optimize incident light capture.

Multi-junction solar cells or tandem cells are solar cells containing several p-n junctions. Each junction can be tuned to a different wavelength of light, reducing one of the largest inherent sources of losses, and thereby increasing efficiency. Traditional single-junction cells have a maximum theoretical efficiency of about 34%, a theoretical "infinite-junction" cell would improve this to 87% under highly concentrated sunlight.

In addition to band gap considerations for a Si/partner tandem system, achieving the desired electronic behavior at the interface between, e.g., Si and its tandem partner presents a significant challenge for production of an integrated solar fuels generation device. For example, the materials must be mutually compatible and generally must operate in a batch reactor that contains an aqueous electrolyte. Such materials considerations are important to the performance of a functioning device that consists of elongated structures embedded in a gas impermeable, ion-exchange membrane, because both semiconductors are simultaneously in contact with the electrolyte to produce a solar-driven water-splitting device. Tandem junction water-splitting devices using nanoscopic or microscopic materials have focused on a single-junction n-n hetero-junction design in series with a liquid second junction. In contrast, the highest efficiency water-splitting devices consist of planar tandem homo-junction photovoltaic cells that are physically isolated from the solution and are electrically connected to the catalysts in contact with solution. The materials currently used in high-efficiency planar tandem devices are not sufficiently stable in concentrated aqueous electrolyte environments. Nevertheless, the concept of buried p-n homo-junctions is a promising route to increase the efficiency of solar water splitting devices relative to systems that utilize n-n hetero-junctions.

To realize the advantages of replacing the n-n hetero-junction with a p-n homo-junction, ohmic behavior at the tandem partner (e.g., Si/partner) interface is used. This ohmic behavior can be achieved in at least two ways: (i) the tandem partners (e.g., the Si-partner) should have proper band alignment (e.g., type III, broken gap) such that upon direct contact, ohmic behavior is produced, or (ii) a discrete intermediate third material must be introduced that facilitates ohmic behavior between the partner light absorbers (e.g., the Si and the tandem partner).

Embodiments of the disclosure comprise elongated structures comprising a plurality of p-n junctions. In one embodiment, an elongated structure of the disclosure comprises at least two p-n junctions. In another embodiment, the elongated structure comprises 3 or more p-n junctions. A multijunction (sometimes referred to as a tandem junction) device consisting of at least one semiconductive (e.g., Si) elongated structure array and another photopotential generating junction connected in series will improve efficiency and the maximum photopotential, i.e. $V_{oc}$, will also greatly increase. This is important for photoelectrosynthetic systems, where the energy in sunlight is directly converted into chemical fuel. For example, in some instances potentials larger than the $V_{oc}$ of a single Si elongated structure array are required, e.g. $H_2/Br_3^-$ from HBr; $H_2/Cl_2$ from HCl; $H_2/O_2$ from $H_2O$, and other reactions where the reduced species contains hydrocarbon and the precursor is $CO_2$ or carbonic acid or its salts or $N_2$ or nitrates/nitrites are reduced to amines.

In one embodiment, the disclosure provides a Si microwire array with a thin emitter layer deposited on the Si microwire. For example, n-type Si elongated structure arrays will be fabricated (n-Si) as described more thoroughly below. Then, a buried-junction will be fabricated as a thin $p^+$ emitter layer (n-$p^+$-Si), using, for example, a boron-nitride/-oxide thermal diffusion source wafer or spin-on dopants glass. A layer of transparent conductive material can then be layered onto the surface of the p-n-Si and further followed by application of a radially-integrated hetero semiconductive material having a different band gap than the underlying core n-Si material. For example, low-temperature plasma-enhanced CVD (PECVD), hot-wire CVD (HWCVD), and/or magnetron sputtering can be employed to deposit a thing a-$p^+$-Si layer 9<100 nm). This would result in two p-n junctions connected both optically and electrically in series.

The disclosure provides a tandem core-shell photoelectrochemical device that comprises a periodic array of buried homo-junction n-$p^+$ (e.g., n-$p^+$-Si) elongated structures that have been sequentially coated with a ohmic radial sheath, which is further coated with a second semiconductive material having a different band-gap than the inner (i.e., first or core) semiconductive material (e.g., an n-$p^+$-Si) elongated structure. As an exemplary embodiment, a tandem core-shell photoelectrochemical device that comprises a periodic array of buried homo-junction n-$p^+$-Si elongated structure that have been sequentially coated with a radial sheath of transparent conductive material (e.g., a transparent conductive oxide such as ITO) and $WO_3$ are described herein. When immersed in air-saturated 1.0M $H_2SO_4$, the dual radial-junction elongated structure enables efficient carrier collection from both the Si and $WO_3$ light absorbers, despite short minority-carrier diffusion lengths, i.e., ~10 µm in Si and ~1 µm, in $WO_3$. A feature of this tandem architecture is the incorporation of the ohmic layer (e.g., ITO layer) between the Si and the second semi-conductive (e.g., $WO_3$) light-absorbing materials. This ohmic contact layer provides facile, low-resistance carrier transport between the Si and second semiconductive material and relaxes the requirements for a defined band alignment between the $p^+$-Si emitter and the semiconductive material. As used herein "ohmic layer" or grammatically equivalents thereof, refers to a layer having low resistance. In other words, the ohmic layer does not have to exhibit an ohmic (i.e., linear) I-V response but rather simply be low resistance. For example, a tunnel junction can be considered an ohmic layer (i.e., highly conductive, but does not necessarily exhibit ohmic I-V responses).

Furthermore, transparent conductive materials are known, and includes for example, transparent conductive oxides (TCOs). Such TCO's are commonly used as back contacts to metal oxides; thus the design of the disclosure provides for a robust implementation because the TCO layer will be amenable to many different Si tandem partner absorbers. Other transparent conductive materials can include nitrides, carbides, chalcogenides and the like.

FIG. 1 depicts an example unit cell of the photoelectrochemical (PEC) device of the disclosure, with one embodiment having rotational symmetry around the vertical axis in the plane of the page. Each elongated structure (20) comprises two semiconductors (20) and (30) with complimentary band gaps, meaning that the sunlight generated photocurrent from each semiconductor is roughly equal when operating at the point of maximum power generation. The semiconductors are arranged electrically and optically in series through a contacting conductor (40). In one embodiment, the conductor is transparent. In this embodiment, the transparency affords maximum absorption of sunlight by the underlying core semiconductor (20). Absorption of photons generates energetic electron-hole pairs that affect fuel forming chemical reactions at semiconductor-anchored catalysts in intimate contact with the electrolyte solution. One embodiment entails a macroscopic device formed as a two-dimensional periodic array of these dual junction microwires. The periodic array geometry provides increased light absorption over conventional planar devices, per mass of material. This increased absorption results from waveguiding and light-trapping effects afforded by the array geometry and physical dimensions of the microwires.

Referring to FIG. 1A a schematic of a device (10) of the disclosure is depicted. FIG. 1A shows an arrangement of a first semiconductive material (e.g., $n^+$-Si) (70) elongated structure with a thin oppositely doped homo-semiconductive material (60) (e.g., $p^+$-Si) deposited on its surface; a transparent conductive material (40) is depicted as being coated on the oppositely doped semiconductive material (60). The transparent conductive material can be, for example, any transparent conductive oxide (TCO) that provides a low resistance radial sheath. Non-limiting examples of transparent conductive oxides include cadmium tin oxide (CTO), indium tin oxide (ITO), fluorine-doped tin oxide (SnO:F or FTO), indium-doped cadmium-oxide, cadmium stannate ($Cd_2SnO_4$ or CTO), doped zinc oxide (ZnO), such as aluminum-doped zinc-oxide (ZnO:Al or AZO), indium-zinc oxide (IZO), and zinc tin oxide ($ZnSnO_x$), or combinations thereof. Other conductors include, for example, AZO, gallium-doped zinc oxide (GZO), ITO:ZnO, ITO:Ti, $In_2O_3$, $In_2O_3$:M (M=Ti, Mo, Ga, W, Zr, Nb), boron-doped zinc oxide (BZO), $Al_2O_3$, MnO, MgO, and Graphene. The TCO is then coated with a second semiconductive material (30) having a wider band gap than the underlying first semiconductive material (70). For example, in FIGS. 1D-F, the wider band gap material is n-doped-$WO_3$.

FIG. 1D shows an individual two-dimensional unit cell. The highly doped p$^+$-Si sheath surrounds a moderately doped n-Si elongated structure core, creating a radial n-p$^+$-Si buried junction. A conformal layer of a TCO (e.g., ITO) surrounds the p$^+$-Si, forming a transparent ohmic contact between the p$^+$-Si and the conformal outer semiconductive layer of n-WO$_3$. A liquid junction is formed between the WO$_3$ and the solution redox couple (shown as the potential of the oxygen evolution reaction (OER)). In this device, the light absorption and carrier-collection advantage of the n-p$^+$-Si elongated structure is also extended to the WO$_3$ photoanode because of its radial-junction geometry with the conformal liquid contact.

FIG. 1D and FIG. 1F depict the device electronic band structures in the absence and presence of illumination, respectively. Illumination (FIG. 1F) results in splitting of the quasi-Fermi levels at both junctions, generating two voltage sources in series. Photoexcited majority-carrier electrons in the n-Si core are transported axially to the back contact through the degenerately doped substrate (n$^+$-Si) to perform the hydrogen-evolution reaction (HER) at a Pt counter electrode, or on the backsides of peeled, freestanding elongated structural arrays, while photoexcited minority-carrier holes are collected radially in the p$^+$-Si sheath. The holes in Si recombine with photoexcited majority-carrier electrons from the n-WO$_3$ at the ITO contact, while minority-carrier holes that are photoexcited in the n-WO$_3$ are collected at the liquid interface and drive the oxidation of water or analyte.

Absorption lengths for indirect band gap semiconductors like Si are large (e.g., hundreds of microns). In planar Si devices light absorption and minority carrier collection occur on the same coordinate, which requires the collection length to match or exceed the absorption length and thus necessitates high purity material. The Si elongated structure geometry provides a carrier-collection advantage through orthogonalization of the light absorption (long axial dimension) and minority-carrier collection (short radial dimension) axes. These advantages allow less semiconductor material per unit area and lower purity semiconductor material than planar devices. Structuring advantages can also be realized by various other geometries. For example, as shown in FIG. 9, pointed or tapered structures or flat tops, can benefit light collection and transduction. Alternative geometries include, but are not limited to, cones, rectangles, pyramids, inverse opals, spheres, ellipsoids, branched wires (like a tree), horn, and dual radii wires to describe a few.

In FIG. 1B, the Si elongated structure of the core is moderately doped n-type ($N_d=10^{16}$-$10^{18}$ cm$^{-3}$) with a thin, degenerately doped p-type emitter ($N_a>10^{18}$ cm$^{-3}$) radial sheath, forming an n-type|p-type (p-n) junction. These doping densities set a lower bound on the wire radius as device performance suffers when the depletion width is greater than the radius of the n-type region. Given the n-type doping densities above and demonstrated degenerate emitters on, e.g., Si elongated structures as small as 100 nm, the lower limit for the radius of the elongated structures can be 136-436 nm for Nd=$10^{18}$-$10^{16}$ cm$^{-3}$, respectively.

The degenerate p-type sheath is connected electrically to the second semiconductor, which is n-type (FIG. 1, photoanode), using a conformal conductor (40). For a high efficiency device, this contact must be ohmic to both the photocathode and photoanode. This uniquely identifies this design scheme from alternative ones where more resistive direct semiconductor-semiconductor contacts are present that often result in sub-maximal photovoltages. The photoanode conformally coats the transparent conductor and is in direct contact with the electrolyte, forming either a semiconductor-liquid junction or a buried p$^+$n-junction near the solution interface. Catalysts are connected electrically to each semiconductor to improve the rates of the chemical reactions and device efficiency. To obtain the largest efficiency, the first semiconductor exposed to sunlight (FIG. 1, photoanode) possesses a larger band gap than the inner semiconductor. This arrangement allows below-band gap light to be transmitted through the outer semiconductor to the smaller-band gap semiconductor where it can be absorbed (e.g., Si, whose bandgap is 1.1 eV). Because the semiconductors are also optically in series, this enables current matching between the semiconductors. Extensive material choices exist for both the anode and cathode. For example, such materials include, but are not limited to, Alternative materials include, but are not limited to a-Si, Ge, GaAs, GaP, CuInGaSe$_2$, CdZnSnSe, WSe$_2$, MoS$_2$, WS$_2$, ZrS$_2$, FeS$_2$ SiP, SiP$_2$, Cd$_7$P$_{10}$, GeS, Sb$_2$S, CuGaSe$_2$, Ag, GeSe$_2$, AgInS$_2$, ZnSiP$_2$, ZnSiAs$_2$, ZnGeP$_2$, ZnGeAs$_2$, CuGeP$_2$InP, CdTe, CdSe, CdS, TiO$_2$, WO$_3$, SnO$_2$, ZnO, CuO, CuO$_2$, BiVO$_4$, Fe$_2$O$_3$, (GaN)$_x$(ZnO)$_{1-x}$, ZnS, InGaN, GaNAs, GaInNAs, GaNP, AlGaAs, AlGaNAs, ZnSnN$_2$, ZnSnP$_2$, Cu$_2$ZnSnS$_4$, ZnOSe, ZnP$_2$, Zn$_2$P$_3$, SrTiO$_3$, BaTiO$_3$, In$_2$O$_3$, InVO$_4$, InNbO$_4$, InTaO$_4$, TaON, TiON, PbMo$_{1-x}$Cr$_x$O$_4$, doped TiO$_2$ (dopant=N, C, (Cr, C), (Mo, C), (W, C), (V, N), (Nb, N), (Ta, N), (Zr, S), (Hf, S), (2Nb, C), (2Ta, C), (Mo, 2N), (W, 2N), (Ta, P), (Nb, P), (Zr, Se), (Hf, Se)), P3HT:PCBM, PTB4:PCBM, and PTB1:PCBM.

Figure 7:
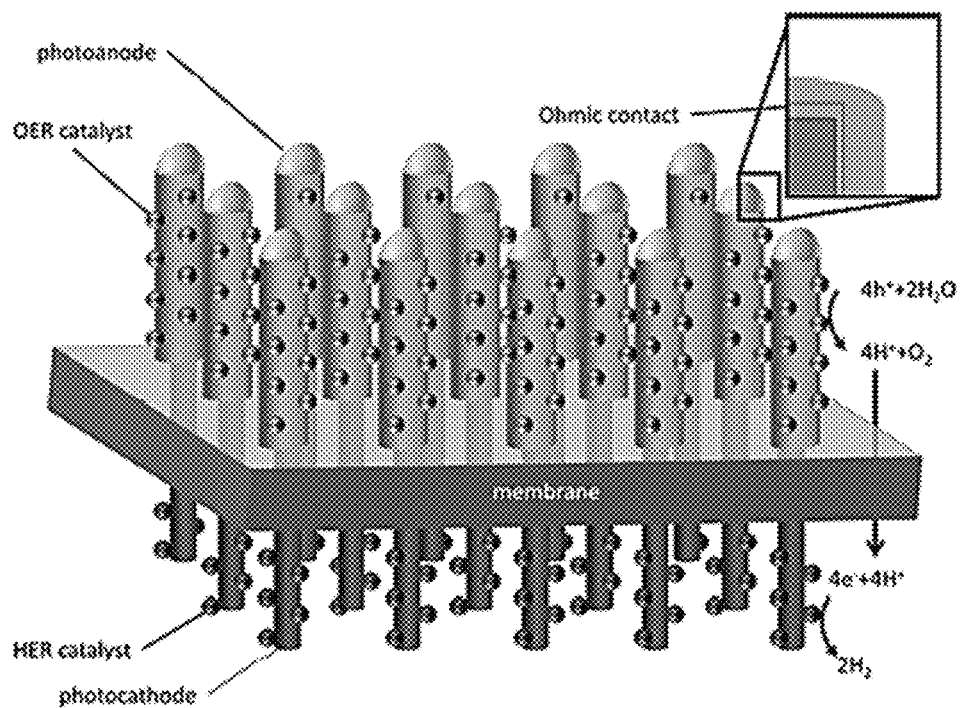
FIG. 7 shows a monolithic, microwire, tandem PEC device depicting a hydrogen evolution reaction (HER) catalyst, oxygen evolution reaction (OER) catalyst, ion-conducting membrane and a photoanode and photocathode separated by an ohmic contact; half reactions for water-splitting under acidic conditions are shown.

An ionomer membrane is deposited conformally around the cathode circumference forming an extended, continuous network between all wires in the array (see, FIG. 1B and FIG. 7). This membrane separates chemical products produced on each side of the membrane while providing ionic transport through the membrane. Many materials meet these requirements for a membrane. For example, such membrane materials include, but are not limited to, Nafion®, Graphene, Nafion®/SiO$_2$, Nafion®/ZrP, Nafion®/Pd, Nafion®/polyvinyl alcohol, Nafion®/montmorillonite, Nafion®/Nafion®-PVDF/Nafion®, Sulfonated Polyphosphazene-PBI, Pd, PEO/KOH, Poly(Ech-co-EO), PVA/KOH, PVA/PEch/KOH, PVA/TEAC/KOH, PVA/PAA, PVA/PEO/KOH, Chitosan, PBI/KOH, PEO-[Si(OCH$_3$)$_3$]$_2$(+), PVA-[Si(OCH$_3$)$_3$]$_2$(+), GMA/γ-MPS, Alkoxysilane/acrylate or epoxy alkoxysilane, Poly(VBC-co-γ-MPS), PPO-Si(OCH$_3$)$_3$(+), PMA-SiO$_2$, PVA/TiO$_2$/KOH, PVA/TiO$_2$, PVA/ZrO$_2$/KOH, PVA/PEI cross-linked DBE, PVA/poly(1,3-diethyl-1-vinylimidazolium bromide), PVA/PAAm, PVA/poly(acrylonitrile-co-2-dimethylaminoethylmethacrylate), Quaternized Ech/PAN/DABCO, Poly(ethylene)/poly(St-co-DVB), LDPE/PVB, PP/PVB, PE/PVB, PVDF/PVB, ETFE/PVB, PETE-FEP/PVB, ETFE-FEP/PVB, PS/DVB, LDPF(IPN), LDPE/HDPE(IPN), PS-b-EB-b-PS, PS/butadiene, YSZ, Bi$_2$O$_3$, Bi$_2$O$_3$—Y$_2$O$_3$, ZrO$_2$—Y$_2$O$_3$, ScSZ, CYO, CGO, CSO, (La, Sr) (Ga, Mg)O$_{3-x}$, Ba$_2$In$_2$O$_5$, La$_2$Mo$_2$O$_9$, M$_{10}$(XO$_4$)6O$_{2+y}$, (M=rare earth or alkaline earth metal, X=P, Si or Ge). In one embodiment, in a water-splitting cell operating under acidic aqueous conditions, the membrane can be a proton exchange membrane such as Nafion®. Mechanical support provided by the membrane enables physical device removal from the growth substrate resulting in a free-standing, flexible PEC device. Device operation follows solid-state drift and diffusion of electrons and holes where two junctions, generally p-n and semiconductor-liquid, drive charge separation under illumination. The resulting photopotential is used to affect chemical reactions such as hydrogen evolution via water splitting. Under solar illumination, photogenerated electron-hole pairs are created in both the elongated structure cores and photoanode shells. Photogenerated carriers in the elongated structure core are separated by the electric field in the radial p-n homojunction. The photogenerated holes are collected radially at the ohmic contact where they recombine with photogenerated majority-carrier electrons from the photoanode. The photogenerated electrons in the core material diffuse axially to the wire base where they are collected at the reductive catalyst to perform the fuel-forming half reaction. Photogenerated carriers in the photoanode are separated by the electric field in the radial semiconductor-liquid junction. The photogenerated electrons recombine with photogenerated holes from the core material at the transparent conductor, as stated above. The photogenerated holes in the photoanode are collected at the oxidative catalyst where they perform the other fuel-forming half reaction. Many fuel forming reactions can be performed with this design where the initial electron arises from any of a variety of different reactant sources. Exemplary fuels that may be generated include, but are not limited to, $H_2$, $CH_3OH$, $CH_2O$, $CH_4$, $CH_2O_2$, $CO$, $C_2H_4$, $C_2H_5OH$, higher hydrocarbons, and reduced $N_2$. Reactant electron sources include, but are not limited to, $H_2O$, $H_2S$, $H_2Se$, $H_2Te$, HI, HBr, HCl, HF, $NH_3$, waste water, and pollutants. The thermodynamic potential required for the desired fuel-forming reaction sets a lower bound to the sum of the semiconductor bandgaps.

Accordingly, the disclosure provides a tandem multi-junction (e.g., at least two materials) sunlight-to-fuel high aspect ratio array device with appropriate radial dimensions based on doping density, wherein a conformal wider band-gap semiconductor coats the structured cathode, either partially or fully, with appropriate thickness based on minority carrier diffusion length and absorption coefficients, and an intervening conductive material (transparent or non-transparent) that affords an ohmic contact between the photoanode and the core semiconductor. In some embodiment, the device can further comprise a continuous ionomer membrane that keeps reactions products separated and provides mechanical support to the structured device.

In one embodiment, the wider band-gap material comprises a III-V material. In another embodiment, the wider band-gap material comprises a II-VI material. In yet a further embodiment, the III-V material is selected from the group comprising AlP, GaP, InP, GaInP, AlGaP, AINP, GaNP, InNP, AlGaInP, AIPN, GaPN, InPN, AlGaNP, GaInNP, AlInNP and AlGaInNP. For example, the outer (second) semiconductive material can comprise a semiconductive material selected from the group consisting of GaAs, GaP, $GaAs_xP_{1-x}$, $Al_xGa_{1-x}$, As, $Al_xGa_{1-x}As_yP_{1-y}$, $In_xGa_{1-x}As$, $In_xGa_{1-x}P$, $In_xGa_{1-x}As_yP_{1-y}$, $Al_xIn_{1-x}As_yP_{1-y}$, $Al_xGa_{1-x}As_yN_zP_{1-y-z}$, $In_xGa_{1-x}As_yN_zP_{1-y-z}$, $Zn_3P_2$, $Zn_3S_2$, and $ZnP_xS_{1-x}$ ($0 \leq x \leq 1$, $0 \leq y \leq 1$, $0 \leq z \leq 1$, $0 \leq y+z \leq 1$) and any of the semiconductive materials set forth elsewhere herein. In a specific embodiment, the wider band-gap coating material comprises GaP or $WO_3$. In one embodiment, the wider band-gap coating material comprises a II-VI material. In a further embodiment, the II-VI material is selected from the group consisting of ZnO, CdSe, CdS, CdTe, ZnO, ZnSe, ZnS, ZnTe, CdZnTe, HgCdTe, HgZnTe, and HgZnSe. In yet another embodiment, the wider band-gap material is coated to about 100 nm to about 20 micrometers thick. Furthermore, it should be recognized that any p-type doped regions of the semiconductive material for any portion of the device schematically presented in FIG. 1 could be changed to n-type and vice versa.

Described somewhat differently, FIG. 1A depicts a schematic of a radial, integrated tandem elongated structure of the disclosure. The tandem elongated structure (10), comprises a first/inner (or core) semiconductive material (20) comprising, for example, a first semiconductive elongated structure having an aspect ratio of greater than 1 (70). The length of the nanostructure may be 1 micrometer or more (e.g., 1 to 999 micrometers) or may be less than a micrometer in length (e.g., 10 to about 999 nm). In one embodiment, the first semiconductive elongated structure can comprise Si. The elongated structure can be grown from a substrate (as described more thoroughly below), which may be removed, depending upon the ultimate use of an array of such radial-integrated tandem elongated structures. An oppositely doped but similar semiconductive layer (60) can be applied to the first elongated structure to encapsulate the first semiconductive elongated structure. An ohmic contact layer (i.e., low resistance layer) (40) is then applied first. The ohmic contact (40) comprises a transparent conductive material (e.g., TCO). An outer/second (or radial) semiconductive material (30) overlays the low resistance material (40). The outer/second junction (30) can be made of the same or different semiconductive material compared to the first/inner junction (20), but will typically be a material having a wider band gap than the inner/first material. In one embodiment, the "core" or inner semiconductive material is Si and the outer or "radial" semiconductive material is CdSe, $WO_3$, $BiVO_4$, $Fe_2O_2$ or amorphous silicon.

In one embodiment the device comprises an Si elongated structure with dimensions of about 10-80 μm length and about 0.5-2 μm diameter grown by the chemical-vapor deposition, vapor-liquid-solid (CVD-VLS) process. The n-type core is doped with phosphorus (P) to a density of about $5 \times 10^{16}$ $cm^{-3}$ while the $p^+$-type shell is doped with boron (B) to a density of about $10^{19}$ $cm^{-3}$. The ohmic contact material in this embodiment can be any ohmic material, but in a specific embodiment is indium-tin oxide (ITO) deposited by sputter deposition. The photoanode is titanium dioxide ($TiO_2$) deposited by electrodeposition, hydrothermal, sputter-deposition or atomic-layer-deposition techniques. Such a system can be used, for example, in a two-electrode electrochemical set-up in acidic $H_2SO_4$ electrolyte with a platinum counter electrode to affect the HER and $TiO_2$ on the surface of the Si structure to affect the OER. Each electrode will be in its own compartment of an electrochemical cell separated by a Nafion® proton-exchange membrane. The compartment containing the platinum electrode will be purged to 1 atm of $H_2$ while the compartment containing the Si—$TiO_2$ photoelectrode will be purged to 1 atm of $O_2$.

The device operates as a solid-state photovoltaic whereby a solid-state Schottky junction is fabricated at the photoanode surface, in place of the electrolyte, and a solid-state ohmic contact is made to the backside of the core microwire array. The height of the photoanode coating can be modulated to increase device efficiency based on material characteristics: absorption (i.e., direct vs. indirect bandgap); contact position (e.g., top of wire only, sides only, everywhere); deposition technique (e.g. electrodeposition, sputtering). In another embodiment, the photoanode can also serve as a OER catalyst, removing the need for deposition of an OER catalyst on its surface. In another embodiment, a p-n junction is made in the photoanode by controllably doping with both n-type and p-type dopants. This lessens the design requirements and relative energetics of the semiconductor and OER catalysts. This device could serve as a fuel forming photo-electro-synthetic device or solid-state photovoltaic device.

In another embodiment, the catalysis reactions at each material can be swapped, such that photogenerated holes perform the OER at the elongated structure backside (now the photoanode) and photogenerated electrons perform the HER at the outer shell semiconductor, which is now the photocathode. Such an arrangement resembles FIG. 1B except that all dopants are opposite of that depicted and the locations of the catalysts are switched. Notably, the photocathode semiconductor coating is p-type.

Figure 11A:
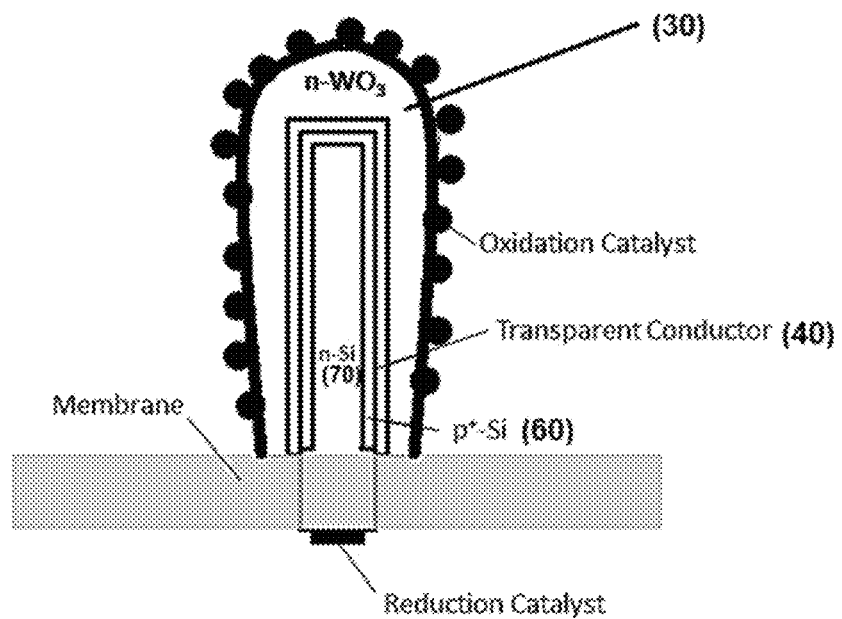
Figure 11B:
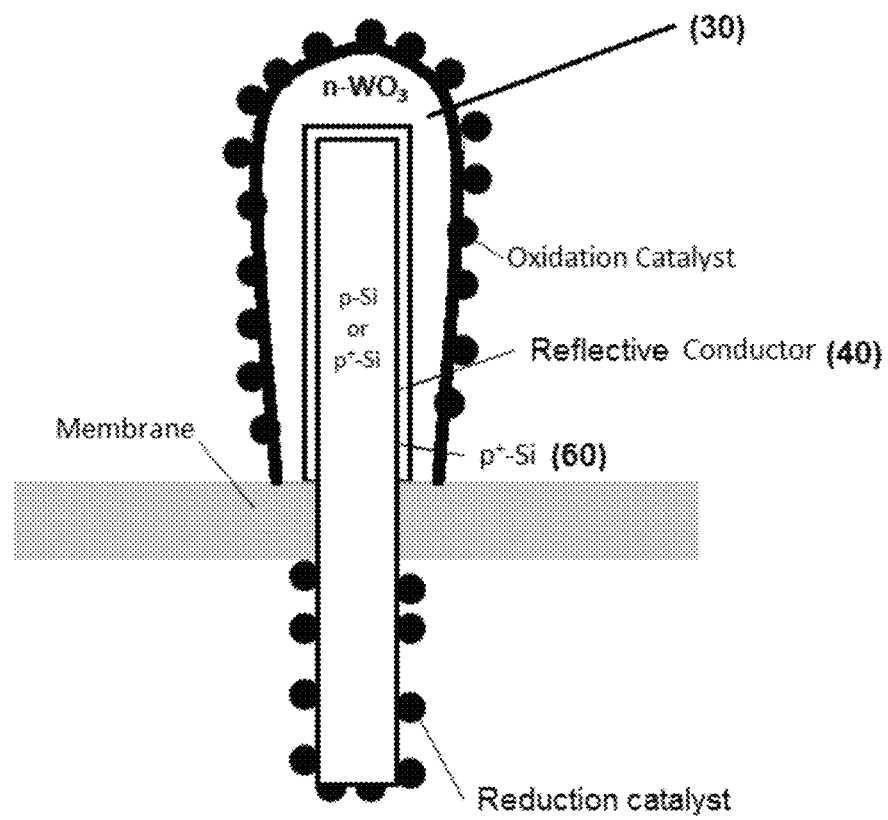

In another embodiment an elongated structural core that is moderately doped p-type with a shell that is heavily doped n-type is provided (see, FIG. 11). In this embodiment, the heavily doped shell is in contact with the electrolyte and forms an ohmic contact with the HER catalyst. The p-type core is electrically connected to the photoanode through either a transparent conductor (TC) or metallic contact. Transparency is not a required characteristic of this material, because much of the Si microwire is exposed and/or the photoanode-coated region contains highly doped, optically inactive Si. A product-impermeable membrane is deposited between the OER and HER catalysts to separate chemical reaction products, thus increasing overall efficiency.

In another embodiment, the transparent conductor is replaced with a thin inorganic material or chemically attached monolayer to the Si that allows electronic transport between materials while maintaining material segregation. An ohmic electrical contact is still present in this embodiment.

In another embodiment, the membrane conformally coats each structured microwire as a thin layer providing vertical ion transport but not mechanical support for the entire microwire array device. Then, a mechanically strong material is placed in between each membrane-coated microstructure.

As depicted in FIGS. 1 and 11, the oxidative catalysts can be placed uniformly, but discontinuously on the photoanode surface. This configuration can lead to deleterious light absorption by the catalyst. Thus, in another embodiment, the deposition and placement of the oxidative catalyst as a discontinuous network in direct physical contact with the top of the membrane and in electrical contact with the photoanode can afford increased light absorption in the semiconductors.

In yet another embodiment, scattering dielectric particles are suspended in the membrane or in a discontinuous network above the membrane, and/or above the catalysts, described above, to increase light absorption in the semiconductors and hide the strongly absorbing catalysts from light (if they are placed in a network below the scatterers).

In one embodiment, the core semiconductor has a pi-n doping configuration and operates under high-level injection, but still generates a $V_{oc}$ that is similar to that obtained for a typical p-n junction. For example, the device in FIG. 1 could comprise an n-type base with an intrinsic core and a p-type sheath. The n- and p-type regions could be doped higher than in FIG. 1, if their respective volumes are kept small.

The disclosure also provides a method of making a radially-integrated tandem elongated structure array of the disclosure. FIG. 2A shows a photolithographically patterned n$^+$-Si<111> wafer (35 (20 in FIG. 1A)) with a SiO$_2$ mask layer (25) and Cu catalyst (15) in the desired growth patterned holes. Other materials may also be used to support growth of an elongated structure, such as a thin Si layer disposed on glass, or other such Si substrates. All or portions of the wafer may be doped. For example, some embodiments may use a degenerately doped n-type Si wafer. In the process a surface oxide layer is thermally grown on the wafer. In one embodiment, the surface oxide layer is grown to a thickness of 285 nm. In another embodiment, the surface oxide layer is grown to a thickness of 300 nm. Other embodiments may comprise oxide layers at other thicknesses. Still other embodiments have the oxide layer deposited via chemical vapor deposition (CVD) or other methods known in the art. Use of the oxide layer is particularly useful in some embodiments of the disclosure. For example, Si wire arrays did not yield high pattern fidelity when the catalyst was not confined using the patterned oxide layer as described above.

The photoresist layer is applied to support the development of a patterned template as discussed below. However, other materials and techniques for creating a patterned template may be used, such as a latex layer, or stamping or soft lithography. The photoresist layer may comprise S1813 photoresist from MicroChem. Corp. (Newton, Mass., USA) or other photoresist material. The photoresist layer is then exposed to ultraviolet-to-visible light through a desired array pattern and developed with a developer to form a desired pattern of holes in the resist layer. The developer may comprise MF-319 or other developers known in the art. The patterned resist layer is then used to etch the oxide layer on the Si wafer. Etching of the oxide layer may be achieved by using hydrofluoric acid compositions such as buffered HF (9% HF, 32% NH$_4$F) from Transene Company, Inc. (Danvers, Mass., USA). Other etching techniques known in the art may also be used to etch the oxide layer. The result of the etching will be a pattern of holes in the oxide layer. A pattern of holes may be, for example, a square array of 3 μm diameter holes that are 7 μm center to center.

The growth catalyst (15) is then thermally evaporated onto the resist layer and into the holes in the oxide layer. Other methods of depositing the catalyst may be used, such as electrodeposition. Typical catalysts comprise gold, copper, or nickel, but other metals known in the art as Si V-L-S catalysts may be used, such as platinum or aluminum. For example, 500 nm of gold may be thermally evaporated onto the resist layer and into the holes. Lift-off of the photoresist layer is then performed, leaving catalyst islands separated by the oxide in the oxide layer. Cost also motivates the use of non-Au catalysts for embodiments according to the disclosure. As indicated above, Cu, Ni, Pt, or Al may be used as a catalyst for Si structure growth. Cu is, unlike Au, an inexpensive, earth-abundant material, and, therefore, of particular interest for such embodiments. Although Cu is more soluble in Si than Au and is also a deep trap, Si solar cells are more tolerant of Cu contamination than of Au, and thus diffusion lengths of at least microns even in the case of Cu catalyzed growth can be expected. As discussed above, other growth catalysts may be used to facilitate the growth of the Si elongated structure in the array. Nominally identical elongated structural arrays may be obtained when Cu, Ni, Pt, or Al (or other Si growth catalyst metals) are used as the VLS growth catalyst instead of Au.

The wafer with the patterned oxide layer and the deposited catalyst may then be annealed. Typically, the annealing is performed in a tube furnace at a temperature between 900 to 1000° C. or at a temperature of about 1050° C. for 20 minutes with the application of 1 atm of H$_2$ at a flow rate of 1000 sccm (where SCCM denotes cubic centimeters per minute at STP). Growth of elongated structures on the wafer is then performed (FIG. 2B). Typically, the elongated structures are grown in a mixture of H$_2$ (1000 sccm) and SiCl$_4$ (20 sccm) at about 1 atm, along with dopant precursors (e.g., BCl$_3$ for B (p-type) doping and PH$_3$ for P (n-type) doping). In one embodiment, the elongated structures are grown for between 20 to 30 minutes at temperatures between 850° C.

to 1100° C. Other embodiments may use different growth times, pressures, and or flow rates. However, optimal growth temperatures are between 1000° C. and 1050° C. Growth for these times and at these temperatures may produce elongated structures from 10 μm to 30 μm in length or longer (FIG. 2C). This SiO$_2$ layer (25) can be formed by (i) dry SiO$_2$ growth, or (ii) infill of polymethyldisiloxane (PMDS) as an etch mask.

Following the growth of the elongated structures, the oxide layer may be removed; however, it is not necessary for the oxide layer to be removed. Removal of the SiO$_2$ by HF etching of the exposed SiO$_2$ portions on the Si elongated structures or PDMS removal can be performed (FIG. 2C). Growth catalyst particles may remain at the top of each grown elongated structures, which may impact the functionality of the resulting array. Therefore, it may be advantageous to remove the catalyst particles. For example, if the catalyst comprises Au, the gold particles may be removed by soaking the wafer 10 for 10 min in a TFA solution from Transene Company, Inc., which contains I$^-$/I$_3^-$. Other methods known in the art may also be used to remove catalyst particles.

A highly doped p$^+$-Si radial sheath (55 or (60; FIG. 1)) is formed by chemical-vapor deposition (CVD) of boron from a BCl$_3$ precursor at 950° C. for 30 min (FIG. 2D). A 400 nm planar equivalent layer of a transparent conductive oxide (65 or (40; FIG. 1)) (e.g., ITO) is then DC-sputtered conformally on the elongated structures, which has been shown to make ohmic electrical contact to p$^+$-Si (FIG. 2E). A film of a second semiconductive material (75 or (30; FIG. 1)) having a different band gap than the underlying Si elongated structure (e.g., n-WO$_3$) is then electrochemically deposited, and annealed at 400° C. for 2 h, to form the radially-integrated tandem elongated structure (FIG. 2F).

According to an embodiment of the disclosure, photolithography is a suitable method for enabling uniform arrays of elongated structures of diameters of ~1 μm to be grown over large areas. In cost sensitive applications such as photovoltaics, it may be desirable to employ lower-cost lithographic methods, and embodiments of the disclosure are readily extendable to alternative patterning techniques such as nanoimprint lithography.

The method described above has been shown to produce nearly defect-free arrays that exhibited an extremely narrow diameter and length distribution, and highly controlled elongated structure position.

In one embodiment, the elongated structures in an array can be embedded in a glass, polymer wax or other material. Of particular interest are proton conducting membranes (e.g., Nafion®). The embedding material can be used to mechanically peel the elongated structure array from the substrate to make a free-standing device. This free-standing device can be contacted electrically to external leads, thus forming a PV cell, or immersed in an electrolyte, after possible deposition of appropriate electrocatalysts, to form a PES cell. Also, ITO could be deposited on the top of this device to make a solid-state PV. In yet another embodiment, a catalyst (e.g., Pt, Ni, Ni—Mo, MoS$_2$ or the like) can be coated on the device to facilitate H$_2$ production from H$_2$O, or other electrochemical half-reactions resulting in a photoelectrosynthetic cell. (See FIG. 7).

The disclosure also demonstrates that geometry of the material can assist in maximizing the efficiency of the photoelectrochemical device. Elongated structures of the disclosure have multiple advantages over the traditional, single, planar photoelectrode model, including (i) serving as a scaffold for the deposition of an ohmic contact and photoanode material ("monolithic") to allow for the combination of both materials' photovoltages in series to attain sufficient voltage to split water, while simultaneously absorbing visible light, (ii) the orthogonalization of light absorption (axial) and carrier transport(radial), which is especially advantageous for indirect bandgap semiconductors, which have long absorption lengths, (iii) increased surface area for catalysis, (iv) approximately a 90% decrease in photoelectrode material usage compared with the planar alternative, depending on pitch and diameter of the elongated structure, (v) radial strain relief for epitaxial growth, enabling the combination of lattice mismatched materials and (vi) logical incorporation of ion-conducting membrane for gas separation and minimization of the distance and resistance of ion migration between the anode and cathode compartments. Nevertheless, nano- and micro-structured devices often exhibit lower open circuit voltages, V$_{OC}$, than their planar counterparts because of the increased junction area, which increases the dark current. The V$_{OC}$ can be calculated from the following equation, where n is the diode quality factor, k$_B$ is Boltzmann's constant, q is electric charge, J$_L$ is the photogenerated current, γ is the ratio of the junction area to the planar area, and J$_0$ is the reverse saturation dark current:

$$V_{oc} = \frac{nk_BT}{q}\ln\left(\frac{J_L}{\gamma J_0} + 1\right)$$

This equation indicates that a 10-fold increase in junction area results in a ~60 mV loss in V$_{OC}$. The decrease in VOC due to increased junction area is an effect of a decreased splitting in the quasi-Fermi levels because the light-generated charge carriers are less concentrated. Despite this disadvantage, micro-structured devices are expected to enhance performance with respect to the planar alternative, provided that (i) the diffusion length, L$_D$, is shorter than the inverse of the absorption coefficient, α, and (ii) the depletion width carrier lifetimes, τ$_{p,D}$ and τ$_{n,D}$, are large. Because silicon is an indirect gap material, the first parameter of L$_D$<<α$^{-1}$ is inherently satisfied when the Si is an type but the purest form.

The efficiency of a PEC device, η$_c$, depends on the power/irradiance of the incident solar flux, P$_{in}$, the absorbed photon flux, J$_a$, the internal quantum efficiency of the photoelectrode, φ$_{int}$, and the reaction potential difference:

$$\eta_c = \frac{J_a \varphi_{ing} \Delta E^0}{P_{In}}$$

In a tandem cell design, the relevant absorbed photon flux and internal quantum efficiency is that of the current-limiting material. Because efficiency is linearly proportional to the amount of light absorbed, maximizing light absorption is integral to achieving a high efficiency device. The following explores techniques to optimize light absorption in the WO$_3$ photoanode material in combination with Si as the photocathode.

Using the modeling described herein, an optimized structure for the transparent contact design is a 5 μm pitch array of spearshaped silicon elongated structure, coated conformally with 100 nm of a transparent contact material with a refractive index in the range of 1.4 to 1.6, subsequently coated in 1 μm of $WO_3$, which has a flat top coated in 100 nm of $SiO_2$, all on top of a back reflector.

Embodiments of the disclosure provide structures that are particularly useful for devices such as solar cells, electronic devices, photonic materials that utilize optical properties of periodic structures of light-absorbing or light-directing materials arranged with structural order in another optically different material, sensors, fuel-forming artificial photoelectrosynthetic solar fuels devices, and similar chemical, optical, and electronic devices and structures.

Embodiments of the disclosure comprise arrays of elongated structures or other semiconducting structures with control of the size, position, and uniformity of the fabricated arrays or structures over a relatively wide area wherein the arrays comprise elongated structures having tandem or multijunction modes. Such arrays of elongated structures can comprise crystalline Si elongated structures of a length long enough to absorb a significant fraction of above-bandgap sunlight, each elongated structure with a radius matched to its diffusion length, and the elongated structures being regularly spaced, and oriented predominantly vertically, typically over large areas. As mentioned herein, the dimensions of the underlying arrays of elongated structures are typically from about 1-10 μm in diameter and 10-100 μm or greater in length. Embodiments of the disclosure may comprise growing the arrays or structures through VLS processes.

Such arrays or structures comprise, in one embodiment, crystalline Si elongated structures of a length long enough to absorb a significant fraction of above-bandgap sunlight, each elongated structure with a radius matched to its diffusion length, and the elongated structures being regularly spaced, and oriented predominantly vertically, typically over large areas. Embodiments of the disclosure can comprise growing the arrays or structures through VLS processes. In such an embodiment, a templating layer is first patterned with openings (e.g., an array of holes) in which the elongated structures are to be grown. The templating layer comprises a diffusion barrier for a deposited catalyst. The diffusion barrier may comprise a patterned oxide layer, a patterned insulating layer, such as a layer comprising silicon nitride, a patterned metal layer, or combinations of these materials or other materials or processes that facilitate the deposition of the catalyst for semiconductor structure growth. The catalyst is then deposited in the openings. Elongated structures are then grown on the substrate by heating the substrate and applying a growth gas.

The elongated structures are then modified to include a p-emitter layer and a radial ohmic layer. This ohmic layer can be selected based upon the ohmic properties as well as its reflective and transparent properties. The ohmic layer can be subsequently coated with an outer radial and epitaxial second semiconductive material having a different band-gap than the underlying core Si elongated structure. The geometry and thickness of the outer radial and epitaxial semiconductive material can be designed to optimize collection of incident light.

The ordered array of elongated structures (e.g., rods/wires) can then be embedded in a matrix material (e.g., glass, wax or a polymer). The array can be embedded to substantially cover the whole length of the elongated structures (e.g., 1-100% of the length), or may be only partially embedded (e.g., 99% or less). The matrix can be useful for removing the array of elongated structures from a substrate. For PES devices the embedding material is typically a proton conducting polymeric material that allows protons to pass from the photoanode side to the photocathode size of the membrane (see FIG. 7).

Thus, in one embodiment the disclosure provides an array of elongated structure (e.g., rods/wires) comprising Si having dimensions of about 1-10 micrometers in diameter and about 1 micrometer to about 100 μm in length coated with one or more layers of the opposite (p/n)-type silicon to form a p-n junction. In some embodiments, the array of elongated structures (e.g., rods/wires) is generated on a substrate. The elongated structures are then coated with a TCO material and a subsequent second radial and epitaxial semicondcutive material having a different band gap than the Si.

A particular application for arrays of elongated structures fabricated according to embodiments of the disclosure are for the use of such arrays in photoelectrochemical cells (PEC) or photoelectrosynthetic (PES) fuel-generating systems. Device analysis has shown that photovoltaic efficiency is maximized in arrays when the mean radius of the elongated structures is comparable to the minority carrier diffusion length. This is because of a trade-off between increased current collection and the loss of open-circuit voltage due to the increased junction and surface area. Diffusion of gold into bulk silicon at the growth temperatures of 1000-1050° C. leads to carrier lifetimes of >1 ns, which combined with carrier mobilities expected for the observed dopant densities, indicates minority carrier diffusion lengths of ~1 μm. However, as described herein, embodiments of the disclosure provide the ability to grow relatively long wire arrays (greater than 30 μm) while maintaining a radius comparable to the minority diffusion length (on the order of 1.5 μm). In some embodiments, these arrays are coated with about 100 nm thick layer of an opposite-type Si emitter layer to give a total layered diameter of about 2.5 micrometers.

Hence, embodiments of the disclosure provide elongated structural arrays with aspect ratios particularly suitable for use in solar cell apparatus. Further, embodiments of the disclosure provide for the ability to have relatively dense arrays of elongated structures, further improving the ability of devices using such arrays to convert light to electrical energy.

The disclosure also provides an artificial photo(electro) synthetic system that utilizes sunlight and water, or other solutions that can be used to generate $H_2$, gas as inputs and produces hydrogen and, for example, oxygen as the outputs. The system comprises three distinct primary components: a photoanode, a photocathode, and a product-separating but ion-conducting membrane. These components may be fabricated and optimized separately before assembly into a complete water-splitting system. The system may incorporate two separate, photosensitive semiconductor/liquid junctions that collectively generate, for example, the 1.7-1.9 V at open circuit necessary to support both the net oxidation and reduction of, for example, water to $O_2$ and $H_2$, respectively.

The photoanode and photocathode may comprise arrays of semiconductive elongated structures of the disclosure comprising a metal catalyst on an amorphous-$p^+in^+$Si cap in tandem with the semiconductive elongated structure, as described herein. The catalysts disposed on the semiconductive structures are used to drive the oxidation or reduction reactions at low overpotentials. Typically the catalysts coated on the semiconducting structures/substrates do not block or inhibit light energy from contacting the semiconducting array or substrate. Accordingly, the catalyst should cover from about 1-99% of the surface area unless sufficiently transparent to allow light penetration to the underlying semiconducting substrate. The high aspect-ratio semiconductor elongated structure electrodes allow for the use of low cost, earth abundant materials without sacrificing energy conversion efficiency due to the orthogonalization of light absorption and charge-carrier collection. Additionally, the high surface-area design of the elongated structure-based semiconductor array electrode inherently lowers the flux of charge carriers over the rod array surface relative to the projected geometric surface of the photoelectrode, thus lowering the photocurrent density at the solid/liquid junction and thereby relaxing the demands on the activity (and cost) of the electrocatalysts. A flexible composite polymer film may be used to allow for electron and ion conduction between the photoanode and photocathode while simultaneously preventing mixing of the gaseous products. That is, the elongated structure arrays may be embedded in flexible, polymeric membrane materials, allowing the possibility of roll-to-roll system assembly. Separate polymeric materials may be used to make electrical contact between the anode and cathode, and also to provide structural support. Interspersed patches of an ion conducting polymer may be used to maintain charge balance between the two half-cells.

In a particular embodiment, the photocathode may comprise vertically (or near vertically) aligned elongated structure arrays made of macroporous p-Si <100> with a resistivity of 13-15 Ωcm and coated/capped with an amorphous $p^+$-i$n^+$-Si cap in tandem with the array of elongated structures.

In another embodiment, the photoanode and photocathode components may be electrically, and ionically, interconnected through, but physically separated by, a flexible composite polymer film. Further, multi-component membranes, composed of polymeric materials, that exhibit desired mechanical pliability, electronic conductivity, and ion permeability properties for a feasible water electrolysis system may be used. Specifically, polypyrrole may be used to make electrical contact between the anode and cathode, while poly(dimethylsiloxane) (PDMS) may be used to provide structural support for the elongated structure arrays. For proton conduction in a cell operated under acidic conditions, Nafion® may be employed, whereas vinylbenzyl chloride modified films of poly(ethylene-co-tetrafluoroethylene) (ETFE), or amine-modified sulfonyl fluoride Nafion® precursors, may be used for hydroxide conduction in a cell operated under alkaline conditions.

In yet another embodiment, a catalyst such as a hydrogen or oxygen evolution catalyst can be coated on the device to facilitate, for example, $H_2$ production from $H_2O$. The catalyst can be any number of catalysts useful as hydrogen or oxygen evolution. For example, suitable hydrogen evolution catalyst can be selected from the group consisting of Pt, Co, Cu, Fe, MoS$_x$ where x is nominally 2, but may be sub or super-stoichiometric, Ni, CoMo, CoW, FeMo, NiCo, NiFe, NiFeC, NiFeS, NiMnS, NiMo, NiMoP, NiSn, NiW, NiZn, NiZnP, CoNiFe, NiCoPMo, NiMoCo, NiMoCu, NiMoFe, NiMoW, NiSiMo, NiSiW and NiWPCu. Suitable oxygen evolution catalysts that can be used in the methods and composition of the disclosure can be selected from the group consisting of IrO$_x$ where x is nominally 2, but may be sub or super-stoichiometric, Pt, Co, Co/(PO$_4$)$^{3-}$, Co/(BO$_3$)$^{3-}$, CoP, Cu, Fe, Mn, Ni, Ni/(BO$_3$)$^{3-}$, NiP, Pb, CoFe, CoPSc$_2$O$_3$, FeMn, NiCo, NiCr, NiCu, NiFe, NiLa, NiLa, NiPSc$_2$O$_3$, NiSn, NiZn and NiMoFe. For example, photocathode side of the membrane can be coated with a hydrogen reduction catalyst such as Pt, or other catalysts that are needed to produce the desired fuels. Where Si elongated structures extend out from the membrane on the photocathode side the elongated structure can be coated with a hydrogen evolution catalyst (see, FIG. 7). Similarly, the photoanode side of the membrane comprises the tandem-radially integrated elongated structure arrays. On the photoanode side the elongated structures are coated with oxygen evolution catalysts. (see FIG. 7).

The following examples are meant to illustrate, not limit, the disclosed invention.

EXAMPLES

Chemicals.

All chemicals were used as received unless noted otherwise. Water was filtered using a MilliPore system and had a resistivity >18 MΩ-cm.

Si Microwire Array Growth.

Phosphorous-doped ($N_D$=3×10$^{17}$ cm$^{-3}$) and boron-doped ($N_A$=1×10$^{17}$ cm$^{-3}$) Si microwire arrays were grown via a Cu-catalyzed vapor-liquid-solid (VLS) process on As-doped $n^+$-Si or on B-doped $p^+$-Si <111> wafers (<0.005 Ω-cm, Addison). The $n^+$-Si and $p^+$-Si <111> growth wafers were received with a 400 nm thick thermal oxide (SiO$_2$) that had been patterned to produce 3 μm diameter holes filled with Cu on a 7 μm pitch The growth of Si microwire arrays was performed in a chemical-vapor deposition (CVD) furnace at atmospheric pressure using SiCl$_4$ (Strem, 99.9999+%) at 25 sccm flow rate, H$_2$ (Matheson, research grade) at 500 sccm flow rate, and BCl$_3$ (Matheson, 0.25% in H$_2$) at 1 sccm flow rate for 20 min or PH$_3$ (Matheson, 100 ppm in H$_2$) at 0.3 sccm flow rate for 9 min. This process produced Si microwires that were 40-70 μm in length, had a diameter of ~2 μm and had doping densities on the order of 10$^{17}$ cm$^{-3}$. Following growth, the samples were cooled to ~200° C. under a 500 sccm flow of He.

Microwire Array Cleaning and Booting.

Microwire arrays were cleaned using a 6:1:1 (by volume) H$_2$O:HCl(fuming, aqueous):H$_2$O$_2$(30% in H$_2$O) metal etch (RCA 2) for 20 min at 60° C. The samples were then subjected to a 15 s etch in buffered HF(aq) (BHF) etch, an H$_2$O rinse, an organic (piranha) etch in 3:1 H$_2$SO$_4$(99.6%, aqueous):H$_2$O$_2$(30% in H$_2$O) for 10 min at room temperature, and an H$_2$O rinse. Following a 30 s etch in 10% BHF and a rinse with H$_2$O, a 150 nm thick SiO$_2$ layer was grown via dry thermal oxidation in a tube furnace at 1050° C. under an O$_2$ atmosphere for 2.5 h. A 15 μm thick PDMS layer was deposited at the base of the wires by spin coating a solution, consisting of 1.1 g of polydimethylsiloxane (PDMS, Sylgard 185, Dow Corning) and 0.1 g of PDMS curing agent dissolved in 5 mL of toluene, on the sample at 3000 rpm for 30 s, followed by a 30 min cure in vacuum oven at 150° C. These PDMS-infilled arrays were submerged in BHF for 5 min, to remove the SiO$_2$ on the exposed microwire surfaces. The PDMS was removed by a 30 min soak in 3:1 N-methyl-2-pyrrolidone(NMP):tetrabutylammonium fluoride(TBAF), followed by a 30 s rinse with H$_2$O. The samples were then dried under a stream of N$_2$(g). Residual organics were then removed by a 10 min etch in a piranha solution.

$p^+$-Si Emitter Formation on n-Si.

A boron-doped $p^+$-Si radial emitter was formed on the n-Si microwire arrays and on planar <111> n-Si wafers (Silicon Inc., 0.7 Ω-cm) by exposure of the samples in a CVD furnace to a 20:400 sccm flow of BCl$_3$ (Matheson, 0.25% in H$_2$):H$_2$(Matheson, research grade) at 950° C. for 30 min, immediately following a 30 sec etch in 10% BHF. The samples were then rinsed with H$_2$O and dried under a stream of N$_2$(g). Secondary ion mass spectrometry data from the planar samples indicated that the emitter thickness was ~200 nm.

Deposition of ITO.

Immediately following a 15 sec etch in 10% BHF, a rinse in $H_2O$ and drying under a stream of $N_2(g)$, 400 nm of In-doped tin oxide was sputtered (48 W, 3 mTorr, 20:0.75 sccm Ar:10% $O_2$ in Ar) onto n-p$^+$-Si microwire arrays and p-Si microwire arrays, by DC magnetron sputtering under 10 W of substrate bias (to facilitate conformal deposition on the microwire sidewalls). The thickness of the ITO was determined by spectroscopic ellipsometry measurements on a planar Si sample.

$WO_3$ Deposition.

n-$WO_3$ was electrodeposited from a tungstic peroxy-acid solution. Briefly, 4.6 g of tungsten powder (0.6-1 µm, 99.99%, Sigma Aldrich) was dissolved in molar excess (60 mL) of $H_2O_2$ (30% in $H_2O$). Excess $H_2O_2$ was dissolved by addition of a trace amount of Pt black (99.9%, Sigma Aldrich) for 24 h. The $H_2O_2$ concentration was monitored by peroxide test strips (EM Quant) until final peroxide concentration was <30 ppm. A concentrated stock solution was made by addition of 80 mL of $H_2O$ and 60 mL of isopropyl alcohol (IPA) to the as made solution. To increase its lifetime, the stock solution was protected from light and stored at 2° C. in a refrigerator. A 3:7 IPA:$H_2O$ mixture was used to dilute the stock solution (3:2 IPA/$H_2O$ mix:stock solution) to generate the deposition solution. Stock solutions were used for one week before and thereafter were freshly prepared. All ITO-coated samples were used as prepared for deposition of $WO_3$, and were contacted directly to the ITO layer using a flat alligator clip. Deposition of $WO_3$ on n-p$^+$-Si and p-Si microwire arrays was performed potentiostatically at −0.5 V vs Ag/AgCl for 60 min. After deposition, all samples were annealed in air at 400° C. for 2 h. This process formed monoclinic $WO_3$, as confirmed by X-ray diffraction data. Cross-sectional SEM data indicated that the $WO_3$ films were ~400 nm thick on Si microwire arrays.

Electrode Fabrication.

Three types of electrodes were tested: n-p$^+$-Si microwire arrays; n-p$^+$-Si/ITO/$WO_3$ microwire arrays; and p-Si/ITO/$WO_3$ microwire arrays. To make ohmic contact to Si substrates that supported the microwire arrays, In—Ga (99.99%, Alfa-Aesar) eutectic was scratched into the backside of the samples. Exposed In—Ga (Si electrodes) was affixed to a coiled Cu—Sn wire with Ag paint (SPI 05001-AB). The active area (~0.12 cm$^2$ for Si microwire arrays) was defined with epoxy (Loctite Hysol 9460) and the entire electrode was sealed with epoxy to the bottom of a glass tube (6 mm O.D.). The electrode orientation, down- or side-facing, was determined by the orientation of the coiled wire that protruded from the glass tube. Geometric areas were measured by scanning the active area, and using software (ImageJ) to calculate the area.

Non-Aqueous Photoelectrochemistry.

Bottom-facing electrodes that contained n-p$^+$-Si microwire arrays were etched for 30 s in 10% BHF immediately prior to introducing the samples into a glove box. Solutions for PEC measurements consisted of $CH_3CN$ (anhydrous, 99.8%, Sigma Aldrich) distilled under $N_2(g)$ (ultra-high purity, Air Liquide) from calcium hydride ($CaH_2$), 1M $LiClO_4$ (battery grade, 99.99%, Sigma Aldrich), and either 25 mM bis(cyclopentadienyl) iron(II) (ferrocene, $FeCp_2^0$, Sigma Aldrich) and 3 mM bis(cyclopentadienyl) iron(III) tetrafluoroborate (ferrocenium, $FeCp_2^+BF_4^-$, Sigma Aldrich), or 20 mM bis(cyclopentadienyl) cobalt(II) (cobaltocene, $CoCp_2^0$, Sigma Aldrich) and 2 mM bis(cyclopentadienyl) cobalt(III) hexafluorophosphate (cobaltocenium, $CoCp_2^+PF_6^-$, Sigma Aldrich). Cobaltocene and ferrocene were purified by vacuum sublimation at room temperature, and cobaltocenium and ferrocenium were recrystallized prior to use. An ELH-type W-halogen lamp with a dichroic rear reflector was used for illumination, and was set to produce the same current density on a calibrated Si photodiode as was obtained from 100 mW-cm$^{-2}$ of 1 Sun AM1.5 G illumination. Three-electrode PEC data were obtained in a single-compartment cell by use of a Gamry potentiostat (Reference 600), with a Pt counter electrode and a Pt quasi-reference electrode at scan rates of 20 mV-s$^{-1}$.

Aqueous Photoelectrochemistry.

Side-facing planar and microwire array (p-Si/ITO/$WO_3$, n-p$^+$-Si/ITO/$WO_3$) devices were tested in 1 M $H_2SO_4$(aq) (trace metal grade, Fischer Scientific) saturated with air. Multiple devices were tested (>5) with the reported results representing the best performing devices. Two-electrode and three-electrode measurements were conducted using a Bio-logic (SP-200) potentiostat in a two-compartment cell (whose compartments are referred to as the anode compartment and the cathode compartment) that contained an epoxied (Loctite Hysol 1C) quartz window on the anode side and a Nafion® (0.05 mm thick, Alfa Aesar) membrane separator between the compartments. Illumination was produced by a Xe lamp (Oriel 67005, Newport Instruments) with an AM1.5G filter (Newport Instruments 81094) that produced light intensities of either 1 (100 mW-cm$^{-2}$) or 12 (1080 mW-cm$^{-2}$) Suns on a calibrated Si photodiode. The concentration value (12×) was determined using the AM1.5D spectrum to be consistent with what would be expected in outdoor testing, although an AM1.5G source was used. Calibration was performed such that the highest light intensity anywhere in the cell was at the cited light intensity and the position of the photodiode at this light intensity was marked to assure sample positioning was at the same point. Optical concentration was achieved using a plano-convex lens (Thorlabs LA4984). The spot size (~1 cm$^2$) overfilled all samples tested (~0.1 cm$^2$).

Three-Electrode Measurements.

Three-electrode measurements were conducted with the working electrode in the anode compartment open to air, an SCE reference electrode (CH Instruments, CHI150) in the anode compartment, and a Pt mesh counter electrode in the cathode compartment at a scan rate of 20 mV-s$^{-1}$. Pt disc (0.0314 cm$^2$) three-electrode measurements were performed with the Pt disc in the cathode compartment and with the SCE reference and the Pt mesh counter electrodes in the anode compartment. For Pt disc measurements, the cathode compartment was saturated with either Ar(g) (research grade, Air Liquide) or $H_2$(g) (research grade, Air Liquide) by bubbling for 15 min before testing and throughout the experiment. All the measurements were referenced to the potential of the RHE (E(H$^+$/$H_2$)), obtained empirically using the Pt disc electrode under 1 atm of $H_2$(g), −0.247 V vs. SCE.

Two-Electrode Measurements.

Two-electrode measurements were made in the same two-compartment cell as used for the three-electrode measurements and with the electrodes in the same physical location. The cathode compartment was purged with Ar(g) or $H_2$(g). A Pt disc electrode was used as the cathode, to simulate the expected catalyst area for an integrated device. The anode compartment contained the working electrode, which was illuminated through a quartz window and was open to air. Chromoamperometric measurements were taken under potentiostatic control at 0 V applied bias between the photoanode and cathode.

Load-Line Analysis.

The Pt disc I-E data were mirrored about the abscissa, to facilitate straightforward evaluation of the projected electrochemical operating conditions of the device. The Pt disc data include the solution and membrane resistances, because the reference electrode was in the opposite cell as the Pt electrode during the measurement. Hence, the Pt disc data should account for all expected cell resistances in the system of interest. The predicted operating currents from the load-line analysis were calculated based on the average of the forward and reverse scans and are $6.7 \times 10^{-3}$ mA ($6.1 \times 10^{-3}$ mA-cm$^{-2}$) and $2.6 \times 10^{-3}$ mA ($2.1 \times 10^{-3}$ mA-cm$^{-2}$) for the Ar(g)- and H$_2$(g)-saturated solutions, respectively. The current densities are calculated per geometrical surface area of the electrode.

Light Absorption Simulation.

Light absorption was simulated in Lumerical FDTD, a commercially available Maxwell's equation solver that uses the FDTD method. The software requires material-specific refractive index data. Experimentally fabricated structures were reproduced in the Lumerical workspace in 2D. Bloch boundary conditions were used to model an infinite planar structure and an infinite 2D microwire array. Each structure was illuminated with single-wavelength plane waves with the electric field polarized in the 2D structured plane, at wavelengths ranging from 350 to 1100 nm in 50 nm intervals. Partial spectral averaging was used to remove simulation artifacts that were caused by the use of single-wavelength simulations. The structure was meshed with 20 mesh boxes per wavelength. The spatially resolved electric field, E, and complex refractive index ($\in$) were recorded and then used to calculate the spatially resolved carrier generation rate, $C_{gen}$ (Equation 1):

$$c_{gen} = \frac{\pi |E|^2 imag(\in)}{h} \quad (1)$$

where h is Planck's constant. The spatially resolved carrier generation rate was used as the optical input for the electronic simulations. The power absorbed in each material was calculated by integrating the spatially resolved absorbed power, $P_{abs}$ (Equation 2).

$$P_{abs} = -0.5\omega |E|^2 imag(\in) \quad (2)$$

The absorbed photon flux in each material as a function of wavelength was weighted with the AM1.5G spectrum, integrated over wavelength, and multiplied by Faraday's constant to obtain a short-circuit current density assuming unity internal quantum yield (IQY). The concentrated illumination modeling was performed at 11 Suns using the AM1.5G spectrum to match the experimental photon flux.

Electronic Simulations.

Electronic simulations were performed in Synopsys Sentaurus, a commercially developed software package that solves the drift-diffusion equation for charge carriers using a finite-element method. For simplicity, a single n-p$^+$-Si homo-junction and an n-WO$_3$/E$^{o'}$(O$_2$/H$_2$O) liquid junction were modeled separately.

n-p$^+$-Si Junction.

The built-in materials parameter file for Si was used with modified time constants ($\tau_n$(N$_A$=10$^{20}$ cm$^{-3}$)=3×10$^{-6}$ s; $\tau_p$(N$_D$=10$^{17}$ cm$^{-3}$)=1×10$^{-3}$ s). The silicon p$^+$-n junction was constructed with a 100 μm thick n-region with N$_D$=10$^{17}$ cm$^{-3}$ and a 0.2 um thick p$^+$-region with N$_A$=10$^{20}$ cm$^{-3}$. In the quasi-neutral bulk of the n-Si, a standard mesh size of 500 nm and 5 μm was used transverse and parallel to the junction, respectively. Near the ohmic contact with n-Si, the mesh was refined to 500 nm and 100 nm, and near the junction, the mesh was refined to 500 nm and 20 nm, to accurately model band-bending in these regions. The J-E (current vs. potential) characteristics of this structure were obtained by first solving for the V=0 case in the dark. Subsequently, the voltage was stepped at 0.01 V intervals in both the positive and negative directions, to obtain the dark J-E behavior. The carrier generation rate from Lumerical was then applied to extract the J-E characteristics in the presence of illumination. Similarly, the V=0 case in the light was solved first, and then the voltage was stepped at 0.01 V intervals, to obtain the light J-E performance. Shockley-Reed-Hall recombination was used for all simulations.

WO$_3$-Liquid Junction.

The built-in "oxide as semiconductor" materials parameter file was used to model WO$_3$, with the following parameters and their values in parentheses: modified band-gap ($E_g$=2.6 eV), work function ($\chi$=4.4 eV), relative permittivity ($\in_r$=5.76), conduction- and valence-band density of states (N$_C$=1.8×10$^{19}$ cm$^{-3}$, N$_V$=7.1×10$^{19}$ cm$^{-3}$), time constant ($\tau_n$=$\tau_p$=1×10$^{-8}$ s) and mobility ($\mu_n$=$\mu_p$=40 cm$^2$ V$^{-1}$ s$^{-1}$). The band-gap was experimentally measured from absorption measurements using an integrating sphere and a Tauc plot. The relative permittivity was calculated from ellipsometric measurements of the complex refractive index. The work function was chosen based on reports found in the literature. The density of states can be calculated from m*, the effective mass of holes in the valence band and of electrons in the conduction band (Equation 3):

$$N_c = 2\left(\frac{2\pi m_e^* k_B T}{h^2}\right)^{\frac{3}{2}} \quad (3)$$

Effective masses in the conduction band have been reported to be ~0.8 m$_0$, where m$_0$ is the mass of a free electron. Density functional theory calculations of the band structure of WO$_3$ indicate that the valence band has less curvature than the conduction band, indicating heavier holes and leading to an estimate of 2 m$_0$ for the hole effective mass. The mobility values were also taken from the literature. Preliminary experimental measurements indicated a diffusion length of 1 μm, thereby determining the time constant.

The WO$_3$/liquid junction was modeled as a Schottky junction, with the metal work function equal to the water oxidation redox potential, $\chi$=5.68 eV, which was in contact with a 1 μm thick slab of WO$_3$. A value of N$_D$=10$^{15}$ cm$^{-3}$ was chosen to match the experimentally observed short-circuit current density and open-circuit voltage. Mesh sizes of 10 nm and 250 nm were used perpendicular and parallel to the junction, respectively. The method to obtain the dark and light J-E behavior was identical to that used for modeling the Si junction. Shockley-Reed-Hall recombination and thermionic emission physics were used for these simulations.

Hydrogen Evolution Catalysis Modeling.

Butler-Volmer kinetics in the absence of mass transport limitations were used with $\alpha$=1 and j$_0$=10$^{-3}$ A-cm$^{-2}$, to simulate the cathodic overpotential (Equation 4) of platinum (Pt) for hydrogen evolution in 1.0 M H$_2$SO$_4$.

$$\eta = -\frac{RT}{F}\ln\left(\frac{j}{j_0} + 1\right) \quad (4)$$

The overpotential was added to the n-p+-Si homo-junction J-E data at the same current density to yield a simulated hydrogen generation device curve in the absence of mass transport.

Light absorption modeling was carried out via full-field (E,H) electromagnetic simulations in a commercial software package, Lumerical FDTD. Simulations were performed at discrete wavelengths, ranging from 350 nm to 1100 nm at 50 nm intervals, to capture absorption distributions up to the band edge of silicon. Discrete wavelength simulations have been shown to outperform broadband simulations. The light absorption in each material was calculated from the spatially resolved electric field data. Light absorption at each wavelength was then weighted by the AM1.5G spectrum to obtain an ideal short circuit current density, assuming unity internal quantum efficiency (IQE). The ideal short circuit current density is the main figure of merit used to evaluate the efficiency of light absorption.

To illustrate the effect of both geometry and material selection on light absorption in a PEC device, two disparate optoelectronic designs (FIG. 2) were explored. The main difference between the two designs is in the optical properties of their contact materials (transparent contact=indium tin oxide (ITO); opaque contact=aluminum (Al)), which motivates different electronic designs.

The aim of the opaque contact design is to enable multiple photon path lengths through the photoanode, which in the case of $WO_3$ ($E_g$=2.6 eV) and other wide bandgap oxides, is the current-limiting material ($J_{sc,ideal}$,$WO_3$=4 mA/cm$_2$ under AM1.5G illumination). As an indirect bandgap material, $WO_3$ greatly benefits from multiple photon path lengths because its optical thickness is ~100 μm near the band edge. The disadvantage of this design is that the opaque contact layer absorbs a significant portion of the light due to surface plasmon absorption.

The standard dimensions for the core/shell Z-scheme model are 7 μm pitch arrays of 100 μm tall silicon microwires with 1 μm radii; the top 50 μm of the wires are conformally coated with 100 nm of a contact material and 1 μm of $WO_3$. The initial shape of the $WO_3$, was chosen as the most likely experimental deposition shape. Many variations on these specifications have been explored.

Figure 8:
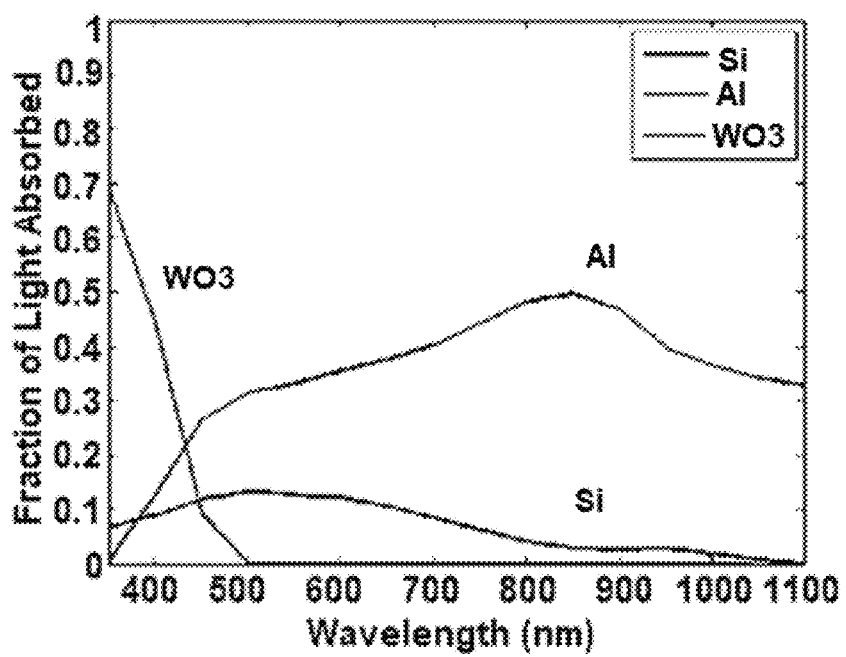
FIG. 8 shows Plot of Si, Al, and WO$_3$ absorption vs. wavelength, showing substantial absorption in the aluminum.

An optically-thick planar aluminum substrate absorbs 7% and reflects 93% of incoming light at normal incidence, which enables multiple photon path lengths through the $WO_3$ via reflection to maximize its absorption. A plot of the fraction of light absorbed by each material versus wavelength is shown in FIG. 8. The aluminum absorbed much more than 7% of the incident light in this design, peaking at around 50% absorption at 850 nm, and amounting to a total of 15.22 mA/cm$^2$.

Investigation of absorption with angle dependence, multiple structural shapes of $WO_3$ and Al (FIG. 9), and different opaque contact materials (e.g. silver) showed that the lossy contact absorption persists when the contact material is opaque across the UV and visible spectrum. These results are indicative of wave guiding effects, including surface plasmon-polariton modes (SPPs), photonic modes, and scattering effects.

For aluminum in $WO_3$, the surface plasmon resonance is at λ=208 nm, implying that the entire AM1.5G Spectrum can potentially couple into an SPP mode. The top edges of the wires enable coupling into a surface plasmon mode. Videos of the propagation of the electric field along the interface at different wavelengths elucidated the existence of an SPP mode at the aluminum interface. The speed of light was slower along the interface with respect to the free space wave, and the electric field decayed evanescently away from the surface. Based on these observations, an SPP mode definitely contributes to the excessive absorption in the aluminum layer. Additionally, the significant enhancement of the aluminum absorption in the wire structure over the planar case (FIG. 10) supports the claim of an SPP mode, which can only be coupled into with the assistance of the wire edges.

Additional waveguiding effects are clearly present due to the silicon wire array geometry. Photonic modes and scattering effects also help account for absorption exceeding that of a planar substrate. Photonic modes are an embodiment of light trapping due to a high index material, which is the case for $WO_3$ and also for aluminum around 800 nm.

The transparent model is of interest due to the major absorption losses associated with the opaque model. The transparent contact incites a decrease in the $WO_3$ current from 1 mA/cm$^2$ (the opaque contact) to 0.7 mA/cm$^2$ because photons only have a single path length through the photoanode material before passing into the photocathode.

To make a transparent contact a viable option for the Si/$WO_3$ system, the $WO_3$ absorption must be increased. One approach is to increase the amount of $WO_3$ material in the design; however, tentative experimental values for the diffusion length are around 1 μm, indicating that increasing the material width to 2 μm may not significantly increase the collected current. However, the synthesis of porous $WO_3$ may remedy this issue; measurements of the diffusion length of porous $WO_3$, revealed effective diffusion lengths of 40 um. These issues are investigated further with carrier transport modeling. Light absorption in $WO_3$ doubles using a design such as model G (FIG. 9) with an ITO contact, resulting in a short circuit current of 1.44 mA/cm$^2$. The main losses in this model are in transmission and reflection, which, unlike contact absorption losses, have simple and thoroughly studied solutions, namely an antireflective coating and a back reflector.

Further optimization of this model was investigated via the incorporation of an AR coating. The optimum index for an AR coating is the square root of the index of the material to be coated. The refractive index of $WO_3$ within its band edge is 2.4, making silicon dioxide ($SiO_2$), with an index of 1.45, a fairly good match. Therefore, a 100 nm coating of $SiO_2$ was added to the top of the $WO_3$. Consequently, reflection losses decreased, and the $WO_3$ current rose to 1.55 mA/cm$^2$. The addition of a back reflector (and no AR coating) affected an increase in the $WO_3$ current to 1.97 mA/cm$^2$, by eliminating transmission losses.

Because the back reflector directs light back into the silicon and subsequently the $WO_3$, the majority of the current gain is observed in the silicon. To decrease transmission in a way that benefits the photoanode preferentially over the photocathode, the pitch can be decreased. With a pitch of 5 um, the $WO_3$ current increases to 1.97 mA/cm$^2$, and the transmission drops to 1.78 mA/cm$^2$. It is important to note that this method decreases the void fraction (and thus, increases the material volume), and therefore will increase the material cost for such a device. Material cost is probably not an issue for silicon and $WO_3$.

When all three of these optimization techniques are combined (AR coating, back reflector, and smaller pitch), the $WO_3$ current reaches 2.1 mA/cm$^2$, which is double that of the original model and achieves 50% of its possible short-circuit current density (4 mA/cm$^2$). Employing these same three changes in the opaque contact design results in a comparable $WO_3$ current of 2.03 mA/cm$^2$, but reduces the silicon absorption to 0.16 mA/cm$^2$. This comparison illustrates the concept that the transparent contact losses are rectifiable while the opaque design losses are not. The remaining losses in the transparent contact design are from reflection and incomplete absorption in the WO$_3$ that is subsequently absorbed by the silicon.

The study of light absorption in the opaque contact design revealed that reflection could be greatly decreased by changing the round morphology of the top of the WO$_3$ to a flat surface (Model A, FIG. 9). When this strategy is applied to the transparent contact design discussed above, the WO$_3$ current increases from 2.1 mA/cm$^2$ to 2.56 mA/cm$^2$. This gain is actually due to the elimination of the focusing effect that is created by the round top. With a flat top, more of the light is directed straight down into the WO$_3$ instead of towards the silicon.

Another means to decrease the losses to silicon is to increase the WO$_3$ thickness. The limit on the effectiveness of this strategy will be determined by carrier transport properties. By increasing the height of the top of the WO$_3$ to 2 µm, the ideal short circuit current increased to 2.6 mA/cm$^2$. This is not a significant gain considering that a portion of it will not be collected due to carrier transport limitations.

Another option is to incorporate a highly reflective (HR) coating between the WO$_3$ and silicon to reflect light back into the WO$_3$ and regain the multiple photon path lengths that were accessible in the opaque contact design. Ideally, a transparent contact material could serve this purpose, as well, with the proper index. The reflection, R, at an interface can be calculated from the following equation, where n$_1$ and n$_2$ are the refractive indices of the first and second media, respectively:

$$R = \left(\frac{n_1 - n_2}{n_1 + n_2}\right)^2$$

Within the band edge of WO$_3$, the refractive indices of WO$_3$ and silicon are roughly 2.4 and 5.6, respectively. The interface between WO$_3$ and silicon reflects 16% of the light back into the WO$_3$. If a layer of SiO$_2$ is placed between the WO$_3$ and the silicon, then 7% will be reflected back into the WO3 at the WO$_3$/SiO$_2$ interface and 36% of the light reaching the SiO$_2$/Si interface will be reflected back toward the WO$_3$; ultimately, a SiO$_2$ layer would theoretically increase reflection back into the WO$_3$ layer by about 25%. For modeling purposes, a 100 nm coating of a dielectric material with a refractive index of 1.5 was used in place of the ITO. This HR coating increased the WO$_3$ current to 2.65 mA/cm$^2$.

For the case of a current-limiting photocathode, the reverse of this strategy should be used. These results reveal that tuning the index of the photoelectrode interfacial material is a more effective means to increase light absorption in a given material than simply increasing material thickness. In fact, index tuning is also more favorable when carrier transport is taken into account, assuming that a low index, electrically-conductive alternative to SiO$_2$ can be used.

Accordingly, an optimized structure for the transparent contact design is a 5 µm pitch array of spearshaped silicon wires, coated conformally with 100 nm of a transparent contact material with a refractive index in the range of 1.4 to 1.6, subsequently coated in 1 µm of WO$_3$, which has a flat top coated in 100 nm of SiO$_2$, all on top of a back reflector.

Although a number of embodiments and features have been described above, it will be understood by those skilled in the art that modifications and variations of the described embodiments and features may be made without departing from the teachings of the disclosure or the scope of the invention as defined by the appended claims.

What is claimed is:

1. An elongated structure comprising:
    a first semiconductive material that includes a first radial junction and a transparent low resistance layer between the first semiconductive material and a second semiconductive material,
    the second semiconductive material having an outer surface, wherein the second semiconductive material comprises WO$_3$ and wherein the outer surface of the second semiconductive material is in contact with a liquid;
    the second semiconductive material and the first semiconductive material being different semiconductive materials and having different band gaps, the elongated structure having an aspect ratio of greater than 1, and
    an outer surface distance changing along a length of a longitudinal axis of the elongated structure, the outer surface distance being a distance between the outer surface and the longitudinal axis and being measured from the longitudinal axis in a direction that is perpendicular to the longitudinal axis to a portion of the second semiconductive material that is located furthest from the longitudinal axis in the direction that is perpendicular to the longitudinal axis.

2. The elongated structure of claim 1, wherein the elongated structure has a dimension comprising 500 nm to about 10 micrometers in diameter and about 1 micrometer to 1 mm in length or wherein the elongated structure has a mean diameter less than 1 micrometer and a length of less than 1 micrometer and an aspect ratio of greater than 1.

3. The elongated structure of claim 1, wherein the first semiconductive material is Si.

4. The elongated structure of claim 1, wherein the elongated structure is substantially embedded in a material selected from the group consisting of glass, polymer and wax.

5. The elongated structure of claim 4, wherein the material forms a membrane comprising the elongated structure embedded in the material extending from and/or through a first surface to and/or through a second surface of the membrane.

6. The elongated structure of claim 1, wherein one end or both ends of the elongated structure are coated with a catalyst.

7. The elongated structure of claim 1, wherein an end of the elongated structure is flat.

8. The elongated structure of claim 1, wherein:
    the first semiconductive material comprises a material selected from the group consisting of crystalline Si, multicrystalline Si, GaAs, InP, CdTe and alloys of any of the foregoing, and group IV metal dichalcogenides; and
    the transparent low resistance layer comprises a material selected from the group consisting of indium tin oxide (ITO), fluorine-doped tin oxide (FTO), and TiO$_2$.

9. The elongated structure of claim 8, wherein the group IV metal dichalcogenides are selected from the group consisting of MoS$_2$, WS$_2$, MoSe$_2$, and WSe$_2$.

10. A solar cell comprising the elongated structure of claim 1.

11. The elongated structure of claim 1, wherein the transparent low resistance layer includes a material selected from the group consisting of indium tin oxide (ITO), aluminum-doped zinc oxide (AZO), fluorine-doped tin oxide (FTO), gallium-doped zinc oxide (GZO), ITO:ZnO, ITO:Ti, $In_2O_3$, indium zinc oxide (IZO), $In_2O_3$:M (wherein M is Ti, Mo, Ga, W, Zr, or Nb), borin-doped zinc oxide (BZO), $Al_2O_3$, MnO, MgO and graphene, and the first semiconductive material is selected from the group consisting of doped Si, undoped Si, GaAs, InP, CdTe, alloys of any of the foregoing, and group IV metal dichalcogenides.

12. The elongated structure of claim 1, wherein the outer surface distance changes such that the elongated structure has a shape selected from the group consisting of a cone, pyramid, inverse opal, ellipsoid, branched wire, horn, and a dual radii wire.

13. The elongated structure of claim 1, wherein the outer surface distance changes such that at least a portion of the elongated structure has a cone shape.

14. The elongated structure of claim 1, wherein an inner region of the first semiconductive material contacts an outer region of the first semiconductive material at the first radial junction, the inner region and the outer being doped so as to have opposing dopant polarities; and the second semiconductive material being doped so as to have the same dopant polarity as the inner region.

15. The elongated structure of claim 14, wherein an inner surface of the second semiconductive material is in physical contact with the transparent low resistance layer.

16. The elongated structure of claim 1, wherein an inner surface of the second semiconductive material is in physical contact with the transparent low resistance layer.

17. The elongated structure of claim 1, wherein the second semiconductive material surrounds the first radial junction.

18. The elongated structure of claim 1, wherein the liquid contacts the outer surface of the second semiconductive material so as to form a second radial junction that is a photoactive junction.

19. The elongated structure of claim 1, wherein a cap portion of the second semiconductive material is positioned over an end of the first semiconductive material and the cap portion has an outside surface that is flat.

20. The elongated structure of claim 1, wherein a cap portion of the second semiconductive material is positioned over an end of the first semiconductive material and the cap portion has an outside surface that is curved.

21. The elongated structure of claim 1, wherein an outside surface of a cap portion of the second semiconductive material is curved such that the outside surface becomes closer to an end of the first semiconductive material as the outside surface approaches the longitudinal axis.

22. The elongated structure of claim 1, wherein a second distance between a perimeter surface of the first semiconductive material and the longitudinal axis is constant along a second length of the longitudinal axis where the second distance is measured perpendicular to the longitudinal axis.

23. The elongated structure of claim 1, wherein a second distance between a perimeter surface of the first semiconductive material and the longitudinal axis changes along a second length of the longitudinal axis where the second distance is measured perpendicular to the longitudinal axis.

* * * * *